(12) United States Patent
Pulici et al.

(10) Patent No.: US 12,170,103 B2
(45) Date of Patent: Dec. 17, 2024

(54) SYSTEM AND METHOD FOR DISK DRIVE FLY HEIGHT MEASUREMENT

(71) Applicant: STMicroelectronics International N.V., Geneva (CH)

(72) Inventors: Paolo Pulici, Lainate Mi (IT); Michele Bartolini, Carpiano (IT); Enrico Sentieri, Lodi (IT); Enrico Mammei, Vittuone (IT); Matteo Tonelli, Parma (IT); Dennis Hogg, Meridian, ID (US)

(*) Notice: Subject to any disclaimer, the term of this patent is extended or adjusted under 35 U.S.C. 154(b) by 0 days.

(21) Appl. No.: 18/448,737

(22) Filed: Aug. 11, 2023

(65) Prior Publication Data

US 2024/0005956 A1    Jan. 4, 2024

Related U.S. Application Data

(63) Continuation-in-part of application No. 17/742,202, filed on May 11, 2022, now Pat. No. 11,756,582.

(51) Int. Cl.
    *G11B 5/60*      (2006.01)
    *G11B 21/10*      (2006.01)

(52) U.S. Cl.
    CPC ............ *G11B 5/607* (2013.01); *G11B 5/6017* (2013.01)

(58) Field of Classification Search
    None
    See application file for complete search history.

(56) References Cited

U.S. PATENT DOCUMENTS

| | | | |
|---|---|---|---|
| 5,311,287 A * | 5/1994 | Amer | G11B 33/10 356/614 |
| 6,046,596 A * | 4/2000 | Schaenzer | G01R 1/07 |
| 6,369,900 B1 * | 4/2002 | Sundaram | G11B 33/10 356/507 |
| 6,950,266 B1 | 9/2005 | McCaslin et al. | |
| 7,023,647 B2 | 4/2006 | Bloodworth et al. | |
| 7,199,960 B1 * | 4/2007 | Schreck | G11B 21/21 360/78.04 |
| 7,256,957 B1 * | 8/2007 | Rahgozar | G11B 5/6017 |
| 7,268,966 B2 | 9/2007 | Pit et al. | |
| 7,394,611 B1 | 7/2008 | Rahgozar | |
| 7,630,162 B2 | 12/2009 | Zhao et al. | |
| 7,729,079 B1 | 6/2010 | Huber | |
| 8,059,357 B1 | 11/2011 | Knigge et al. | |
| 8,139,310 B1 | 3/2012 | Hogg | |
| 8,320,069 B1 | 11/2012 | Knigge et al. | |
| 8,503,128 B2 | 8/2013 | Graef | |
| 8,576,509 B1 | 11/2013 | Hogg | |
| 8,611,035 B1 * | 12/2013 | Bajikar | G11B 5/6017 360/75 |
| 8,619,383 B1 | 12/2013 | Jung et al. | |

(Continued)

*Primary Examiner* — Peter Vincent Agustin
(74) *Attorney, Agent, or Firm* — Slater Matsil, LLP

(57) ABSTRACT

A system for determining a fly height includes a first head of a disk drive, a second head of the disk drive, a capacitive sensor circuit coupled to the first head and the second head, and a logic device coupled to the capacitive sensor circuit. The capacitive sensor circuit is configured to measure a first capacitance between the first head and the first disk, remove noise from the first capacitance using a second capacitance between the second head and the second disk, and based thereon determine a corrected first capacitance. The logic device is configured to determine the fly height between the first head and the first disk using the corrected first capacitance.

20 Claims, 18 Drawing Sheets

(56) References Cited

U.S. PATENT DOCUMENTS

| | | |
|---|---|---|
| 8,773,802 B1 | 7/2014 | Anderson et al. |
| 8,773,807 B1 | 7/2014 | Chia et al. |
| 8,837,070 B1 * | 9/2014 | Johnson ............... G11B 5/6017 360/39 |
| 9,042,208 B1 | 5/2015 | Knigge et al. |
| 11,756,582 B1 * | 9/2023 | Pulici ................... G11B 21/106 360/78.04 |
| 2002/0001151 A1 * | 1/2002 | Lake ...................... G11B 33/10 |
| 2003/0011915 A1 * | 1/2003 | Riddering ............. G11B 5/6005 360/75 |
| 2008/0037155 A1 * | 2/2008 | Hirano ............... G11B 5/59627 |
| 2008/0158715 A1 * | 7/2008 | Hirano ................. G11B 5/6005 |
| 2008/0266702 A1 * | 10/2008 | Bliss ................... G11B 5/6005 |
| 2024/0005956 A1 * | 1/2024 | Pulici ................... G11B 5/6017 |

* cited by examiner

SYSTEM AND METHOD FOR DISK DRIVE FLY HEIGHT MEASUREMENT

CROSS-REFERENCE TO RELATED APPLICATIONS

This application is a continuation-in-part of U.S. patent application Ser. No. 17/742,202 filed on May 11, 2022, which application is hereby incorporated herein by reference.

TECHNICAL FIELD

The present invention relates generally to disk drives, and, in particular embodiments, to systems and methods for measuring fly height distance of a disk drive head over a disk.

BACKGROUND

Generally, hard disk drives (also referred to as hard disks, hard drives, or fixed disks) record data on disks (also referred to as platters) by magnetizing a thin film of ferromagnetic material on the thin disk. The disks are flat, circular platters of a non-magnetic material such as glass, aluminum, or the like. The film is magnetized by disk drive heads (also referred to as read-and-write heads, or heads) that are moved into close proximity with each respective disk. The heads perform read operations and write operations on the thin films of ferromagnetic material on the disks. It is advantageous for the heads to have a very small distance from the top surface of the disk (referred to as a fly height distance) in order to reduce errors in read and write operations. However, too small of a fly height distance results in the heads physically contacting the disks while the hard disk drive is spinning the disks, which causes catastrophic damage to the disks. As such, systems and methods for measuring the fly height distance with increased accuracy are desirable.

FIG. 1 illustrates a cross-sectional view of an example system 50 of a head 10 over a disk 30. The disk 30 has a ferromagnetic film 32 covering a surface facing the head 10. The film 32 includes a plurality of magnetic regions 34 (illustrated as boxes with up and down arrows in FIG. 1), each of which includes a few hundred magnetic grains. Each magnetic region 34 has a polarity in an up direction or a down direction in order to encode data in a binary format.

The head 10 includes a reader element 12 to perform read operations on the magnetic regions 34 and a writer element 20 to perform write operations on the magnetic regions 34. The head 10 is mounted at a distance $D_1$ from the top surface of the disk 30 in a range of 10 nm to 20 nm. The disk 30 is rotated (e.g., at speeds in a range of 4,000 RPM to 16,000 RPM) while the head 10 is moved to an appropriate radial distance to perform the read or write operations on the magnetic regions 34. The reader element 12 is disposed between a first shield 14 and a second shield 16. The reader element 12 detects the grain orientations of the magnetic regions to determine the polarity of the magnetic regions, which encode binary values of 0 or 1.

The writer element 20 is an electromagnet made from a magnetizable material (e.g., ferrite or permalloy) that becomes magnetized in the presence of a magnetic field. When a current is passed through a coil 22 (e.g., a wire, as shown in cross-section in FIG. 1), a strong magnetic field is formed between opposite sides of the writer element 20. The magnetic field of the writer element 20 then acts on the magnetic regions 34 of the disk 30 to align them with a desired polarity, thus writing bits of data to the disk 30.

As the magnetic regions 34 are very small (e.g., with respective lengths of about 10 nm and respective widths of about 40 nm) and the writer element 20 is of similar size to the magnetic regions 34 (e.g., with a length and width of about 40 nm), it is advantageous for the writer element 20 to be moved to a distance $D_2$ from the surface of the disk 30 that is smaller than the distance $D_1$. For example, a distance $D_2$ of 1 nm allows for more accurate interaction between the magnetic field of the writer element 20 and the targeted magnetic region 34. A larger distance $D_2$ results in neighboring magnetic regions 34 being affected by the magnetic field of the writer element 20, leading to write errors on the disk 30.

The distance $D_2$ is achieved by heating the writer element 20 with a thermal element 24 (e.g., a coil). This distorts the profile of the portion of the head 10 around the writer element 20, decreasing the distance between the head 10 and the disk 30 from the distance $D_1$ to the distance $D_2$. This increases the performance of the writer element 20 and decreases write errors by allowing the magnetic field of the writer element 20 to accurately saturate the targeted magnetic regions 34. In this figure, the fly height adjustment of the head by use of the heater element is exaggerated by the downward bulge in a normally flat head surface.

The distance $D_2$ that the head 10 is held above the disk 30 while the disk 30 is rotating is also referred to as the fly height. Measuring the fly height accurately is critical to hard disk drive performance. A fly height that is too large (e.g., greater than 3 nm) increases read and write errors, but a fly height that is too small (e.g., smaller than 0.5 nm) increases the probability of a catastrophic head crash. This occurs when the head 10 makes physical contact with the disk 30 while the disk 30 is rotating at high speed, creating severe scratches and permanent damage to the film 32.

SUMMARY

In accordance with an embodiment, a system for determining a fly height includes: a first head of a disk drive, the first head being adjacent to a first disk; a second head of the disk drive, the second head being adjacent to a second disk; a capacitive sensor circuit coupled to the first head and the second head, where the capacitive sensor circuit is configured to: measure a first capacitance between the first head and the first disk, remove noise from the first capacitance using a second capacitance between the second head and the second disk, and based thereon determine a corrected first capacitance; and a logic device coupled to the capacitive sensor circuit, the logic device being configured to determine the fly height between the first head and the first disk using the corrected first capacitance.

In accordance with another embodiment, a system for determining a fly height includes: a first head of a disk drive, the first head being adjacent to a first disk; a capacitive fly height sensor circuit coupled to the first head, where the capacitive fly height sensor circuit is configured to measure a first capacitance between the first head and the first disk; a second head of the disk drive, the second head being adjacent to a second disk; a reference capacitive sensor circuit coupled to the second head, where the reference capacitive sensor circuit is configured to measure a second capacitance between the first head and the first disk; and a logic device, the logic device being coupled to the capacitive fly height sensor circuit and the reference capacitive sensor circuit, where the logic device is configured to: remove noise to correct a measurement of the capacitive fly height sensor circuit using a measurement of the reference capacitive sensor circuit; and determine the fly height between the first head and the first disk using the corrected measurement of the capacitive fly height sensor circuit.

In accordance with yet another embodiment, a method for operating a disk drive includes: selecting a first head for an operation on a first disk; moving the first head closer to the first disk; measuring a first capacitance between the first head and the first disk; correcting the measurement of the first capacitance using a second capacitance as a reference, the second capacitance being between a second head and a second disk; adjusting a fly height of the first head using the corrected measurement of the first capacitance; and performing the operation on the first disk with the first head.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. The references used herein are provided merely for convenience and hence do not define the extent of protection or the scope of the embodiments.

Current techniques to measure the fly height of a head over a disk include using thermal sensors to detect very small changes in thermal conductivity as the head approaches the disk. However, using thermal conductivity to measure fly height is often unreliable, and more accurate methods of measuring the fly height are desirable.

Figure 1:
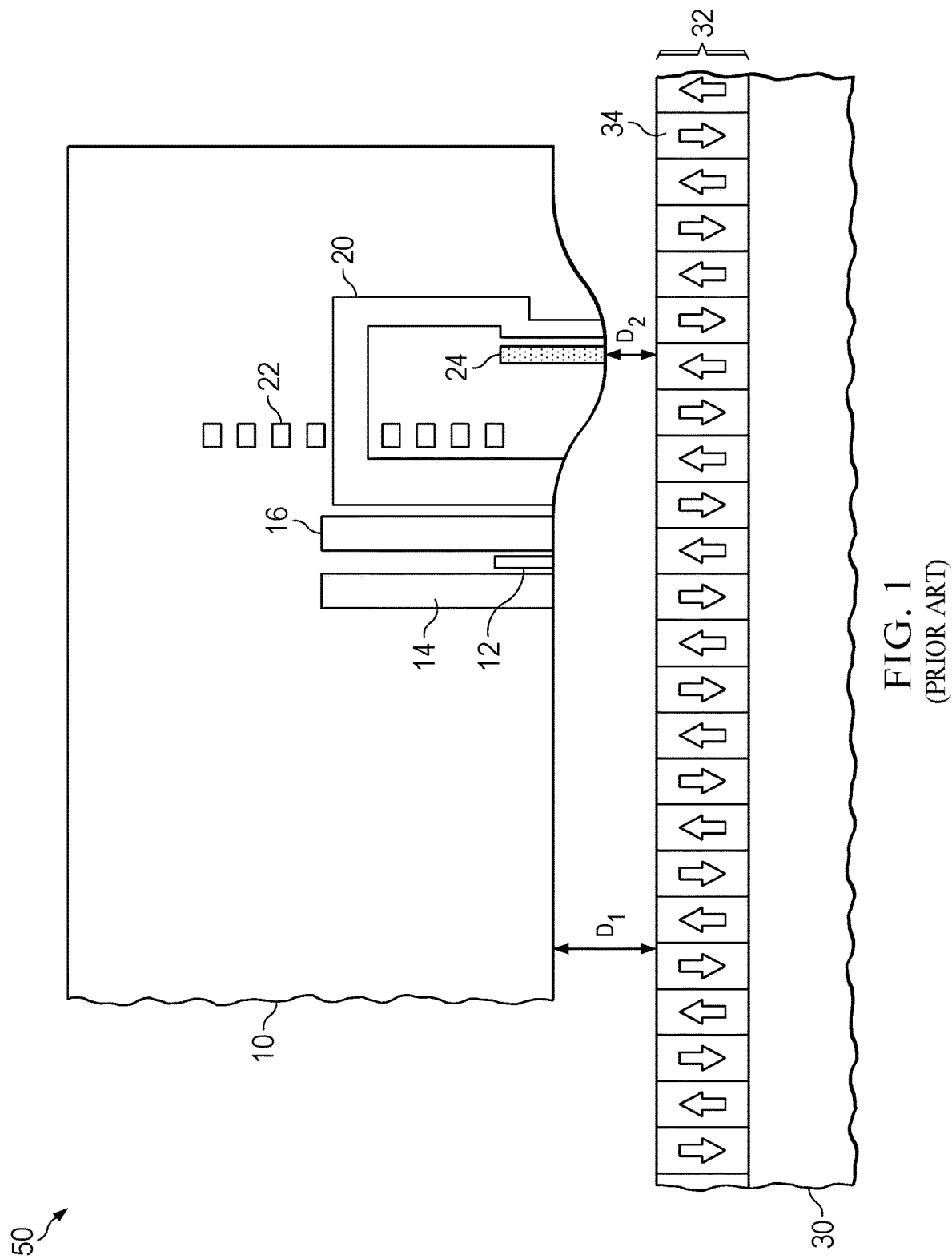
FIG. 1 illustrates a cross-sectional view of an example system of a disk drive head over a disk.

It is appreciated that the system 50 of FIG. 1 is a non-limiting example presented to illustrate the problem of fly height measurement identified by the inventors. Hard disk drives and other systems benefitting from accurate fly height measurement as discussed in this application may have any suitable configuration and are not limited to the structures shown in FIG. 1.

According to one or more embodiments of the present disclosure, this application relates to methods of decreasing the effect of ground bounce and thermal drift on measuring a fly height distance of a selected hard disk drive head over a disk with a capacitive sensor.

Embodiments of the disclosure are described in the context of the accompanying drawings. An embodiment of a hard disk drive head apparatus having a plurality of heads will be described using FIGS. 2A-2D. A system for a capacitive fly height sensor with ground sensing will be described using FIG. 3. A system for a capacitive fly height sensor with ground sensing using a differential approach will be described using FIG. 4. A system incorporating two capacitive fly height sensors will be described using FIG. 5. A system incorporating two capacitive fly height sensors, each having an oscillator circuit and each having a ground bounce sensing circuit, will be described using FIG. 6. A system incorporating two capacitive fly height sensors, each having a respective oscillator circuit and both sharing a common ground bounce sensing circuit, will be described using FIG. 7. An embodiment method for operating a disk drive using the systems of FIG. 3, 4, 5, 6, or 7 will be discussed with FIG. 8. Systems comprising switches between reference sensor circuits and disk drive heads will be described using FIGS. 9-11. Systems for capacitive fly height measurement comprising built-in self-test functionality will be described using FIGS. 12-14. An embodiment method for testing a circuit using the systems of FIGS. 12-14 will be discussed with FIG. 15.

The fly height of a disk drive head over a disk may be measured using the property of capacitance rather than the property of thermal conductivity. The fly height can be determined by measuring the capacitance of a capacitor formed by the hard disk drive head with the disk. The capacitance will be inversely proportional to the distance between the head and the disk and the distance can be found by a precise measurement of the capacitance. However, using the capacitance to determine the fly height presents additional challenges, including degradation from ground noise, variation of capacitive sensor performance versus temperature (also referred to as thermal drift), and spin speed error. Embodiments of the disclosure address the ground noise and thermal drift by using a second hard disk drive head to compensate for the ground noise and thermal drift.

Figure 2A:
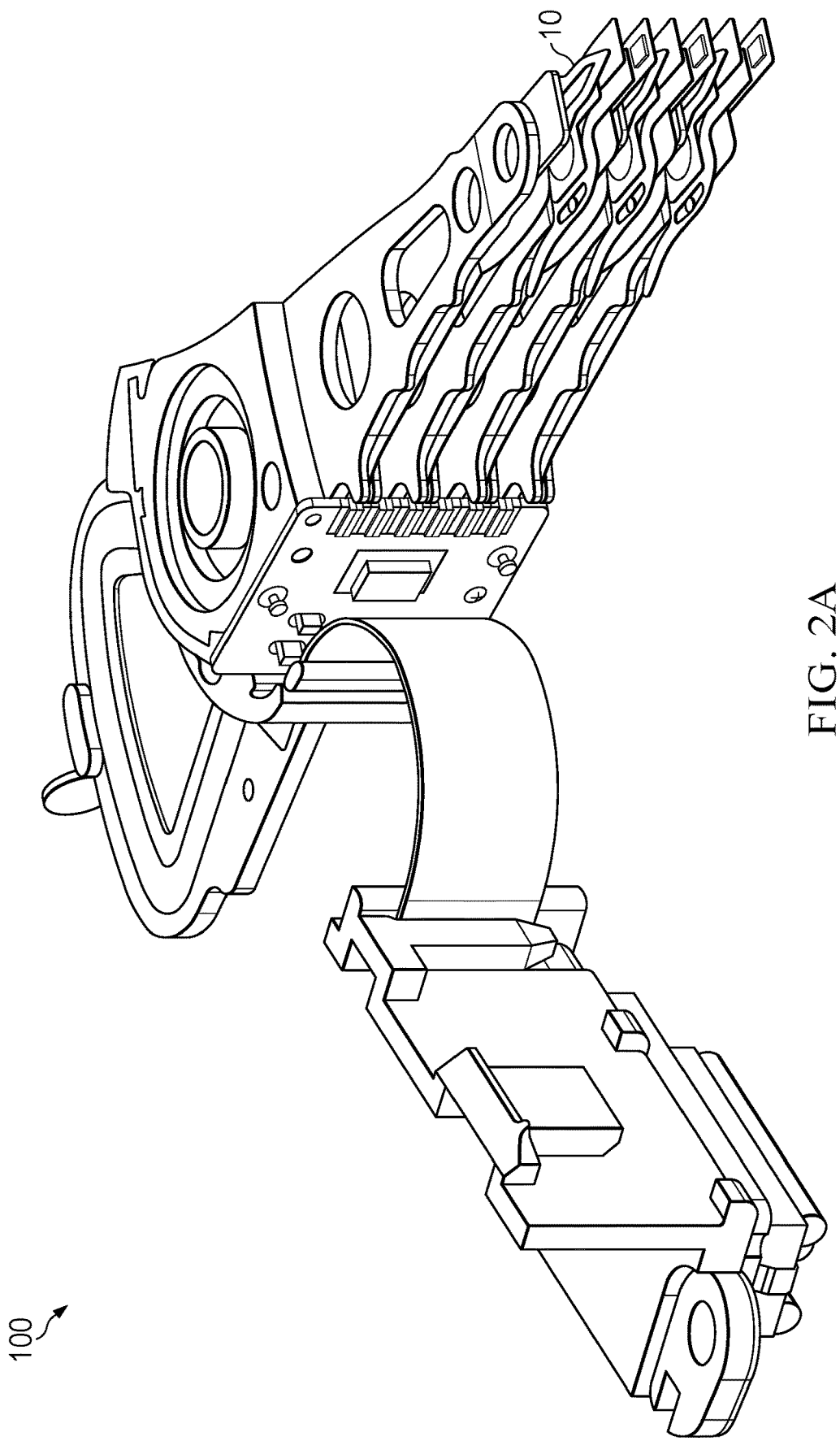
FIG. 2A illustrates a perspective view of a hard disk drive head apparatus having a plurality of heads, in accordance with some embodiments.
Figure 2B:
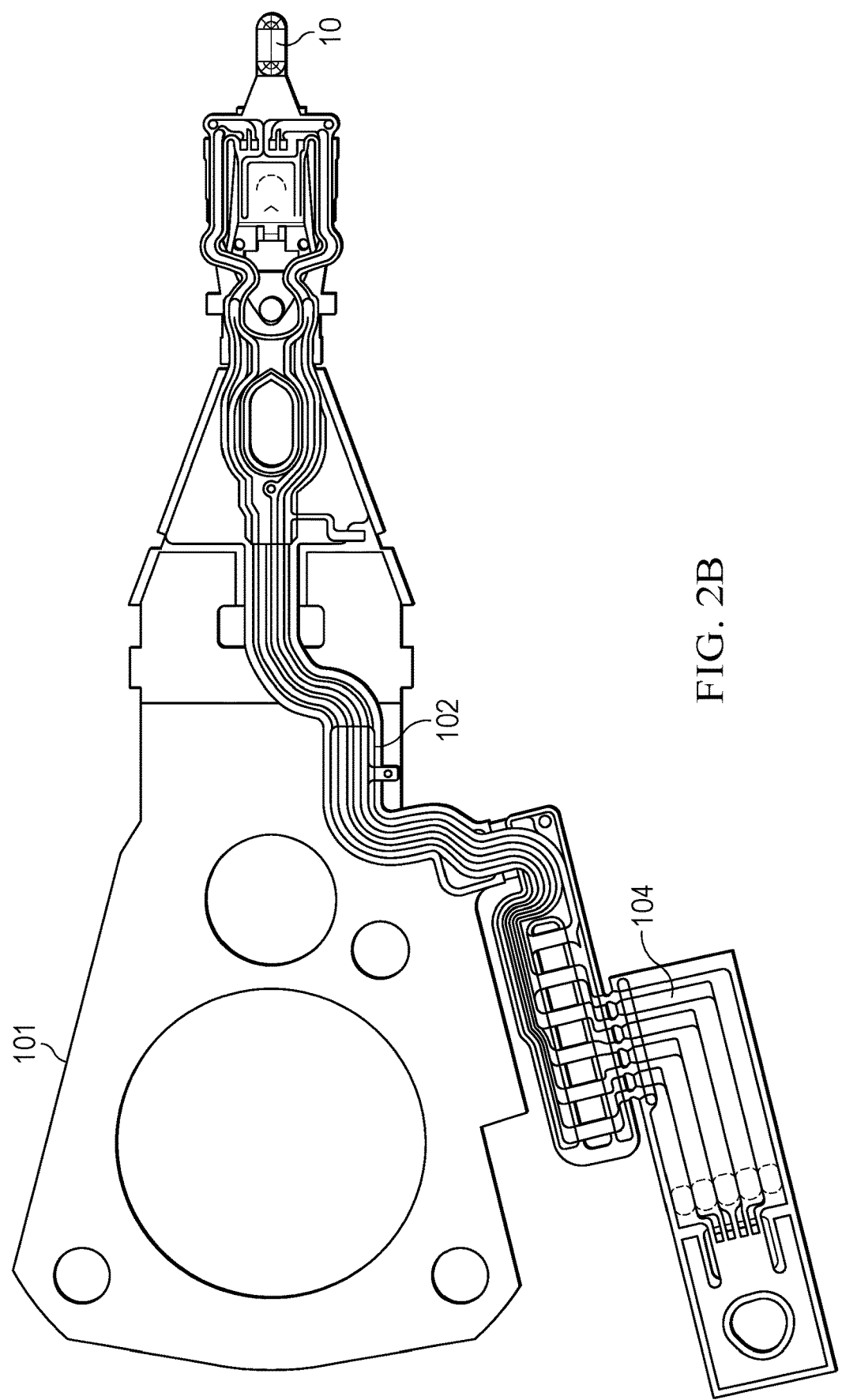
FIG. 2B illustrates a head mounted to a suspension assembly, in accordance with some embodiments.
Figure 2C:
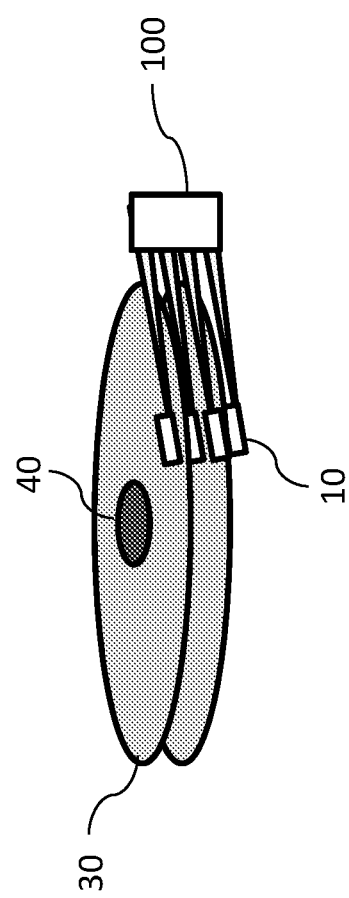
FIG. 2C illustrates a perspective view of a hard disk drive head apparatus adjacent to two disks, in accordance with some embodiments.
Figure 2D:
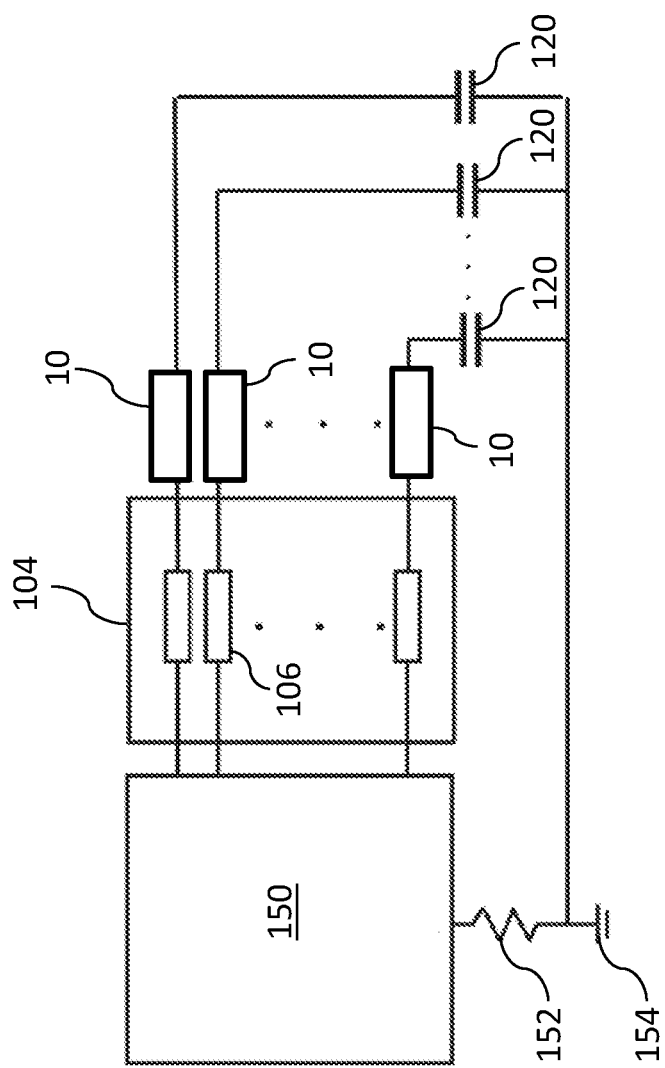
FIG. 2D illustrates a schematic of the hard disk drive head apparatus of FIG. 2A, in accordance with some embodiments.

FIG. 2A illustrates a hard disk drive head apparatus boo having a plurality of heads 10, FIG. 2B illustrates a head 10 mounted to a suspension assembly 101, FIG. 2C illustrates a perspective view of a portion of the hard disk drive head apparatus wo adjacent to two disks, and FIG. 2D illustrates a schematic of the hard disk drive head apparatus 100 of FIG. 2A. Disk drives (e.g., hard disk drives) generally include respective pluralities of read/write heads.

FIG. 2C illustrates an example disk drive having two disks 30 adjacent to each other, with one disk 30 stacked on top of the other disk 30. The disks 30 rotate around a spindle 40. The heads of the hard disk drive head apparatus 100 are arranged to face respective sides of the disks 30. Each head 10 may be used to read from or write to one side of a disk 30.

A hard disk drive will usually include two heads 10 for each disk 30. Although FIG. 2C illustrates a hard disk drive with two disks 30 and four heads 10, any suitable number of heads 10 and disks 30 may be used. For example, a hard disk drive with one disk 30 may have two heads 10, a hard disk drive with two disks 30 may have four heads 10, and a hard disk drive with three disks 30 may have six heads 10.

In some commonly used modes of operation, only one selected head 10 out of the plurality of heads 10 is activated while reading or writing to a disk 30. The other heads 10 of the plurality of heads 10 are inactive while the selected head 10 is active. Thus, it is possible to use any other components of the other heads 10 while the selected head 10 is active. Embodiments of the present disclosure use a capacitive sensor of an inactive head 10 in order to reduce the effects of ground bounce and thermal drift on measurements of fly height made with a capacitive sensor of the selected head 10.

As illustrated in FIGS. 2B and 2D, each of the plurality of heads 10 is coupled to one or more preamplifier(s) 150 (also referred to as a preamp). FIG. 2B illustrates a head 10 mounted to a suspension assembly 101. The head 10 is coupled through a trace 102 mounted on the suspension assembly 101 to a flexible connection 104 (also referred to as a flex) that is coupled to the preamplifier 150 (not illustrated in FIG. 2B). FIG. 2D shows a schematic of the preamplifier 150 and its connections to ground and each of the heads 10 of the plurality of heads 10. The preamplifier 150 is coupled to a ground 154 (e.g., the ground of the film 32; see above, FIG. 1) through a resistor 152. In some embodiments, the resistor 152 is not an intended component of the system, but rather includes resistance present in circuit traces and connections (e.g., the trace 102) between the preamplifier 150 and the bulk metal of the hard disk drive head apparatus 100 (see above, FIG. 2A). Each of the heads 10 of the plurality of heads 10 is coupled to the preamplifier 150 through individual connections 106 in the flexible connection 104. The individual connections 106 may have lengths of about 2 cm. Each head 10 is coupled to the ground 154 across a respective capacitor 120, where the capacitor 120 is the respective capacitive sensor used to determine the fly height of each head 10 above each respective surface of the disk 30 (see above, FIG. 1).

The preamplifier 150 may be subject to a source of ground noise referred to as ground bounce due to the variation in voltage across resistor 152 that affects capacitive sensors using the capacitors 120. The preamplifier 150 may have multiple additional circuits that are rapidly switched on and off at various times during operation of the disk drive. At least some of these additional circuits may consume large amounts of current that flows to the ground 154 through the resistor 152. This may lead the electric potential of the traces to the ground 154 inside the preamplifier 150 to be different from the electric potential at the ground 154 that is coupled to the heads 10 across respective capacitors 120. This variation in electric potential from the voltage drop across the resistor 152 may add to the voltages on each capacitor 120. This added voltage from the voltage drop across the resistor 152 is not distinguishable by capacitive sensors from voltages across the capacitors 120. As such, this effect is known as ground bounce and is a source of unwanted noise that may corrupt fly height measurement by a capacitive sensor. Additional ground noise may arise from different disturbances (e.g., from radio frequency (RF) to low frequency perturbations, such as in a range of 1 Hz to 10 GHz) occurring between the preamplifier 150 and the disk 30.

Capacitive sensor circuits may also be affected by thermal drift, as the capacitive sensor circuit performances vary with temperature. For example, power dissipation of the preamplifier 150 may be very different between an idle/read mode of the disk drive and a write mode (e.g., a difference in the order of Watts). This power dissipation may lead to significantly different temperatures during different modes of operation of the disk drive. As the capacitive sensors may perform differently at different temperatures, this temperature variation across different modes of operation may affect the accuracy of the fly height measurement using the capacitive sensor. For example, the temperature variation may alter the performance of the circuits inside the preamplifier 150 that measure the capacitance and erroneously detect a capacitance change that does not actually exist in the capacitors 120. As a result, the measurement circuit can falsely report a fly height change (corresponding to a capacitance change) that did not physically happen due to the detection circuit temperature changing.

Additionally, some embodiments of a capacitive sensing circuit incorporates the capacitive sensor as part of a circuit that modifies an oscillator frequency as capacitance changes. The frequency may be measured by counting the number of oscillator cycles that occur in a time interval. The disk rotational period of the disks 30 may be used as a convenient time interval for counting numbers of oscillations to determine the capacitance of the capacitive sensor (see below, FIG. 3). As such, error on the spin speed may impact the accuracy of the fly height measurement. The capacitive sensors may be affected by spin speed error arising from, for example, rotational shock affecting the spin rate of the disks 30.

In order to achieve a desired accuracy of fly height measurement, the accuracy of the capacitance measurements by the capacitive sensor are advantageously in a range of 0.2% to 1% error. The capacitance of circuit components coupled to the capacitor 120, the head 10, and the preamplifier 150 (e.g., the trace between the head 10 and the preamplifier 150, various output drivers, resistors, or the like) may have a total capacitance in a range of 10 pF to 20 pF. This is comparable to the capacitance of the capacitor 120, which may be in a range of 20 pF to 100 pF. However, the change in capacitance of the capacitor 120 as the fly height of the head 10 changes may be in a range of $\frac{1}{10}^{th}$ to $\frac{1}{100}^{th}$ of the total capacitance of the circuit components (e.g., a range of 1 pF to 2 pF, or a range of 0.1 pF to 0.2 pF). As such, the effects of ground bounce, thermal drift, and spin speed error may affect the much larger total capacitance of the circuit components and produce errors of 1% or greater on the measurement of the fly height.

As such, it is desirable to reduce the effects of all impairments on the accuracy of fly height measurement. This can be achieved by using an unselected head 10 to remove sources of error (e.g., ground bounce, thermal drift, or spin speed error) that may be very similar across all heads 10. Thus, the sources of error may be subtracted out using the unselected head 10 as a reference.

It is appreciated that the hard disk drive head apparatus 100 and parts thereof as illustrated in FIGS. 2A through 2D is a non-limiting example presented to illustrate a typical disk drive apparatus having multiple heads. Disk drive head apparatuses or any other devices benefitting from embodiments of the disclosure may have any suitable configuration and are not limited to the structures shown in FIGS. 2A through 2D.

Figure 3:
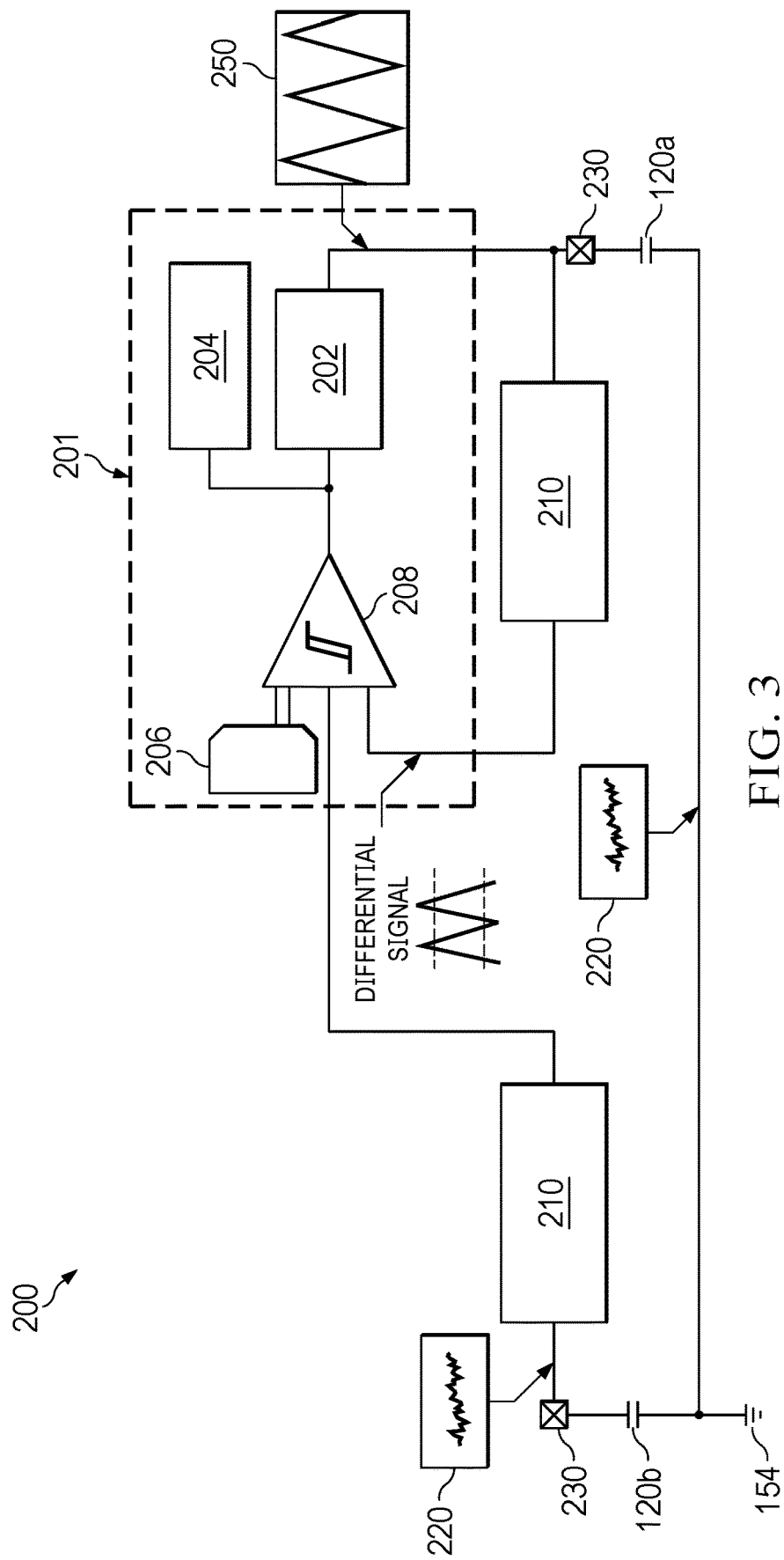
FIG. 3 illustrates a schematic of a system for capacitive fly height measurement, in accordance with some embodiments.

FIG. 3 shows an example schematic of a system 200 for a capacitive fly height sensor with ground sensing, in accordance with some embodiments. A triangular wave current oscillator is implemented that charges and discharges the capacitance of a capacitor formed between a selected head 10 and a disk 30 (see above, FIG. 1). The number of oscillations of the triangular wave oscillator may be counted over a known interval (e.g., a revolution of the disk 30; see above, FIG. 2C) to determine the period of the oscillator. The period is proportional to the capacitance between the selected head 10 and the disk 30. As such, the fly height may be measured by counting the number of oscillations of the triangular wave current oscillator over the known interval.

As illustrated in FIG. 3, a selected head 10 that is active for writing to a disk 30 (is coupled to a ground 154 across a capacitor 120a, where the ground 154 is the disk 30 and the capacitor 120a is formed between the selected head 10 and the disk 30. A capacitive sensor circuit 201 processes a signal from the capacitor 120a to measure the capacitance of the capacitor 120a. In some embodiments, the capacitive sensor circuit 201 includes a current source 202, a counter 204, a threshold digital-to-analog converter (DAC) 206, and a hysteresis comparator 208.

Further referring to FIG. 3, the capacitor 120a is charged by a current source 202. In some embodiments, the current source 202 is coupled to the capacitor 120a across a node 230, such as a pin coupling the selected head 10 to a semiconductor chip containing a counter circuit for the triangular wave current oscillator (e.g., the preamplifier iso). The total impedance of the capacitive sensor circuit 201 as measured from the node 230 to ground may be greater than 1 mega Ohm.

The current source 202 may produce a constant current $I_{chg}$ in a range of 1 µA to 100 mA, generating an increasing voltage across the capacitor 120a and node 230. The voltage may be amplified and buffered by a quality booster circuit 210. When the voltage increases to a value determined by a threshold digital-to-analog converter (DAC) 206, the output of the hysteresis comparator 208 transitions from a low state to a high state causing the current source 202 to reverse direction and remove charge from capacitor 120 which reduces the voltage on node 230. The voltage reduces until the voltage observed at the input of hysteresis comparator 208 is lower than the low threshold of threshold DAC 206, causing the output of the hysteresis comparator 208 to transition to the low state. The low state output causes current source 202 to switch to supplying current into capacitor 120a. This cyclic behavior causes multiple increase and decrease voltage changes on node 230 that approximate a triangle wave. The charging and discharging of the capacitor 120a can be done with a fixed current source, with a current through a resistor (e.g., an RC profile), or with other repeatable profiles. The frequency of the triangular wave 250 is affected by the capacitance of the capacitor 120a, which changes in proportion to the changing of the fly height of the selected head 10.

The hysteresis comparator 208 receives the triangular wave 250 with frequency affected by the capacitance of the capacitor 120a and compares the triangular wave 250 with a threshold voltage Vth provided by the threshold digital-to-analog converter (DAC) 206. The hysteresis comparator 208 then outputs a counter-current, which is received by a counter 204 together with the pulsed current from the current source 202. The counter 204 (e.g., a register in the preamplifier 150; see above, FIG. 2D) is configured to count the pulses of the counter-current output by the hysteresis comparator 208 combined with the pulsed current from the current source 202 over a set time interval (e.g., one rotation of the disk 30; see above, FIG. 2C). The resulting pulse rate measured by the counter 204 will have a period proportional to the capacitance $C_{hd}$ of the capacitor 120a, given by the equation $$T \propto \frac{C_{hd} \times V_{th}}{I_{chg}}.$$

As such, counting the number of oscillations of the capacitor 120a charging and discharging per each revolution of the disk 30 allows a measurement of the fly height of the selected head 10 to be made. In some embodiments, a logic device (see below, FIG. 5) is coupled to the capacitive sensor circuit 201 and computes the fly height using the measured capacitance of the capacitor 120a.

In some embodiments, the hysteresis comparator 208 is coupled to the capacitor 120a through a quality booster circuit 210. The quality booster circuit 210 may include elements such as a gain-increasing element (e.g., an operational amplifier), a low-pass filter, a level shifter, or a combination thereof. The quality booster circuit 210 may increase the suitability of the triangular wave 250 at the capacitor 120a as an input for the hysteresis comparator 208.

Noise 220 may be present in the circuit due to ground bounce, thermal drift, or spin speed error. This noise 220 will affect the charging and discharge of the capacitor 120*a*, and so may alter the measurement of the fly height. The noise 220 may be canceled by including a ground bounce sensing circuit having a capacitor 120*b* on an unselected head 10 (see above, FIG. 2A) in the system 200. The capacitor 120*b* is coupled to the same ground 154 as the capacitor 120*a* (e.g., opposite sides of the same disk 30 or a side of an adjacent disk 30 at a same electric potential as the disk 30). As such, the capacitor 120*b* will experience the same ground noise (e.g., ground bounce or other perturbations) as the capacitor 120*a*, and the noise 220 on the capacitor 120*b* will be the same as the noise 220 on the capacitor 120*a*. The capacitor 120*b* is coupled to the hysteresis comparator 208 in order to supply the noise 220 to the hysteresis comparator 208 as a differential signal. In this way, the noise 220 on the capacitor 120*a* may be canceled from the measurement of the fly height of the selected head 10.

In some embodiments, the capacitor 120*b* is coupled to the hysteresis comparator 208 across another node 230, such as a pin coupling the unselected head 10 to a semiconductor chip containing a counter circuit for the triangular wave current oscillator (e.g., the preamplifier iso). In some embodiments, the hysteresis comparator 208 is coupled to the capacitor 120*b* through another quality booster circuit 210.

Although the example of FIG. 3 illustrates a triangular wave current oscillator, the capacitive sensor circuit 201 may also be an oscillator implementing a sinusoidal wave, a square wave, or a sawtooth wave. Any suitable capacitive sensor circuit 201 is within the scope of the disclosed embodiments.

The example of FIG. 3 refers to a capacitor 120*a* of a selected head 10 that is being used for a disk operation (having its fly height being adjusted) and a capacitor 120*b* of an unselected head 10 that is latent (having a constant fly height). However, it should be appreciated that the system 200 may also function in a reciprocal fashion when the head 10 coupled to the capacitor 120*b* is selected for a disk operation and the head 10 coupled to the capacitor 120*a* is latent. As such, either capacitor of the capacitor 120*a* and the capacitor 120*b* may have its capacitance measured when the respective head 10 of the capacitor is selected, and the other capacitor of the capacitor 120*a* and the capacitor 120*b* may be used as a reference for ground noise subtraction while the respective head 10 of the other capacitor is latent. Additionally, the system 200 may include couplings to additional capacitors of additional heads of a head apparatus 100 having a plurality of heads 10 (see above, FIG. 2A). Any head 10 of the plurality of heads 10 may be the selected head 10, and any other unselected head 10 may be used as a reference for ground noise subtraction.

Figure 4:
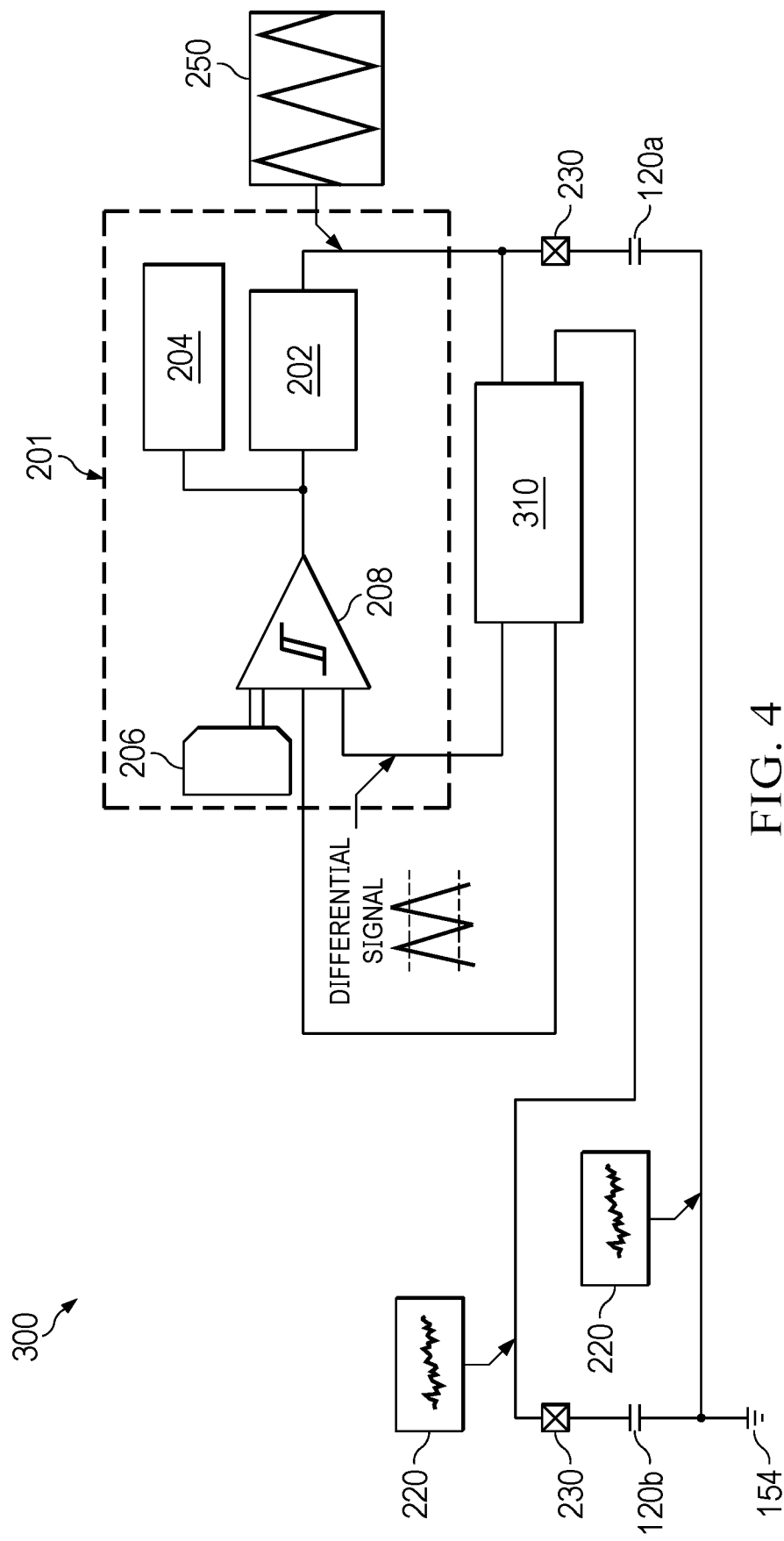
FIG. 4 illustrates a schematic of a system for capacitive fly height measurement, in accordance with some embodiments.

FIG. 4 illustrates an example schematic of another system 300 for a capacitive fly height sensor with ground sensing, in accordance with some embodiments. The system 300 is similar to the system 200 as shown above in FIG. 3, except that the capacitor 120*a* and the capacitor 120*b* are both coupled to the hysteresis comparator 208 through a same differential quality booster circuit 310. The differential quality booster circuit 310 may include elements such as a gain-increasing element (e.g., an operational amplifier), a low-pass filter, a level shifter, or a combination thereof. The differential quality booster circuit 310 may also perform subtraction of the noise 220 from the triangular wave 250 prior to the triangular wave 250 being supplied to the hysteresis comparator 208. An example of a differential quality booster circuit 310 is an amplifier that preferentially amplifies the difference between the two capacitor voltages. This may be done by forcing a common mode voltage on the unselected head 10 (coupled to the capacitor 120*b*) to remove a common mode voltage present on the selected head (coupled to the capacitor 120*a*).

Figure 5:
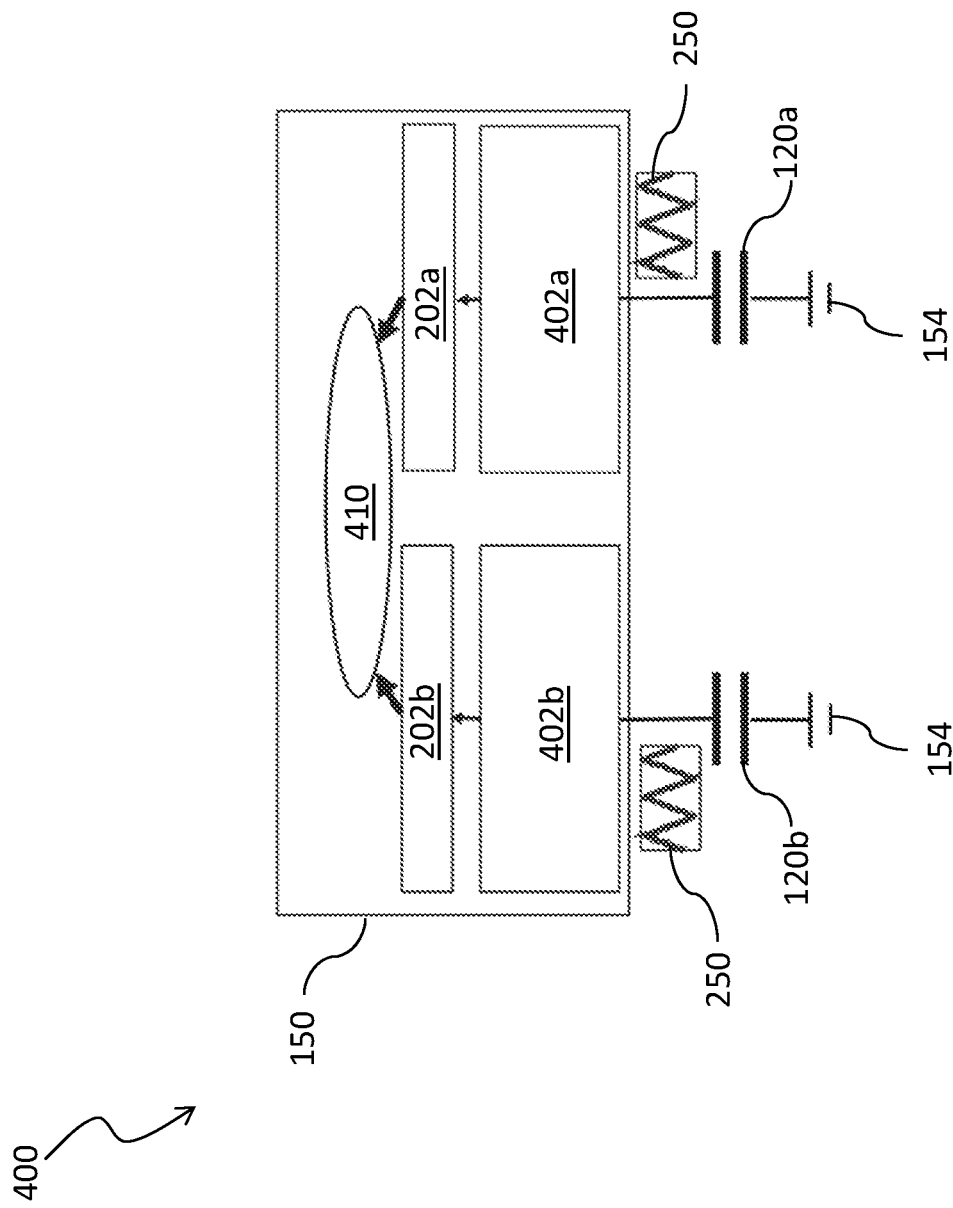
FIG. 5 illustrates a schematic of a system for capacitive fly height measurement, in accordance with some embodiments.

FIG. 5 illustrates a schematic of a system 400 incorporating two capacitive fly height sensors, in accordance with some embodiments. The system 400 includes a capacitive fly height sensor circuit 402*a* coupled to a capacitor 120*a* of a selected head 10 (see above, FIG. 2A) and a reference capacitive sensor circuit 402*b* coupled to a capacitor 120*b* of an unselected head 10. The capacitive fly height sensor circuit 402*a* is coupled to a sensor counter 202*a* and the reference capacitive sensor circuit 402*b* is coupled to a reference counter 202*b*. The sensor counter 202*a* and the reference counter 202*b* may be similar to the counter 204 as described above with respect to FIG. 3. The sensor counter 202*a* and the reference counter 202*b* are coupled to a logic device 410. The capacitive fly height sensor circuit 402*a*, the reference capacitive sensor circuit 402*b*, the sensor counter 202*a*, the reference counter 2o2*b*, and the logic device 410 may be part of a preamplifier 150 (see above, FIG. 2D).

The capacitive fly height sensor circuit 402*a* processes signal from the capacitor 120*a* to measure the changing capacitance of the capacitor 120*a* of the selected head 10. For example, in embodiments where the selected head 10 is similar to the head 10 as described above with respect to FIG. 1, the capacitance of the capacitor 120*a* may change as the fly height of the selected head 10 is adjusted. The fly height may be controlled by distorting the profile of the selected head 10 through heating the selected head 10 with a thermal element 24 (see above, FIG. 1). As an example, the capacitive fly height sensor circuit 402*a* may be similar to the system 200 described above with respect to FIG. 3, without the inclusion of the capacitor 120*b* and other components connecting the capacitor 120*b* to the hysteresis comparator 208. However, any suitable circuit for measuring the capacitance of the capacitor 120*a* may be used for the capacitive fly height sensor circuit 402*a*.

As the capacitive fly height sensor circuit 402*a* may be subject to distortions from, e.g., thermal drift or spin speed error, the system 400 includes a reference capacitive sensor circuit 402*b* coupled to a capacitor 120*b* of an unselected head 10. Although the unselected head 10 is not active (e.g., its fly height is constant and its respective thermal element is disabled), the reference capacitive sensor circuit 402*b* has a similar design as the capacitive fly height sensor circuit 402*a* and shares the same references (e.g., a same DAC threshold, a same charge/discharge current from a same current source, or the like). Additionally, the reference capacitive sensor circuit 402*b* experiences the same uncontrolled parameters as the capacitive fly height sensor circuit 402*a*, such as thermal drift from different amounts of power dissipation in the preamplifier 150, ground bounce, or spin speed error. Since the capacitance of the capacitor 120*b* is constant while the unselected head 10 is not in use and its fly height is constant, any changes in the oscillation frequency of, for example, a triangular wave 250 in the reference capacitive sensor circuit 402*b* will be due to the distortive effects of the uncontrolled parameters.

Additionally, the frequency of a waveform (e.g., a triangular wave 250) in the capacitive fly height sensor circuit 402*a* and measured by the sensor counter 202*a* will be subject to the same distortive effects (e.g., preamplifier parameter variability or common noise) as the frequency of a waveform (e.g., a triangular wave 250) in the reference capacitive sensor circuit 402*b* and measured by the reference counter 2o2*b*. The logic device 410 may then use the reference counter 202b to cancel the distortive effects experienced by the capacitive fly height sensor circuit 402a from the measurement of the sensor counter 202a, thus improving the measurement of the fly height of the selected head 10. In this way, thermal drift, common mode noise (e.g., ground noise present on the capacitor 120a and the capacitor 120b), and possible time reference variation (e.g., from spin speed error) may be compensated for in the capacitive fly height sensing measurement for the selected head 10. The removal of the distortive effects from the measurement of the sensor counter 202a using the measurement of the reference counter 202b may be implemented with software, firmware, hardware, the like, or a combination thereof in the logic device 410.

The example of FIG. 5 refers to a capacitive fly height sensor circuit 402a coupled to a selected head 10 that has its fly height being adjusted and a reference capacitive sensor circuit 402b coupled to an unselected head 10 that is latent and has a constant fly height. However, it should be appreciated that the system 400 may also function in a reciprocal fashion when the head 10 coupled to the capacitive fly height sensor circuit 402a is selected for a disk operation and the head 10 coupled to the reference capacitive sensor circuit 402b is latent. As such, the capacitive fly height sensor circuit 402a may be used as a reference for noise subtraction while the reference capacitive sensor circuit 402b is used for measuring fly height. Additionally, the system 400 may include couplings to additional capacitors of additional heads 10 of a head apparatus 100 having a plurality of heads 10 (see above, FIG. 2A). Any head 10 of the plurality of heads 10 may be the selected head 10, and any other unselected head 10 may be used as a reference for common mode noise or time reference variation subtraction.

Figure 6:
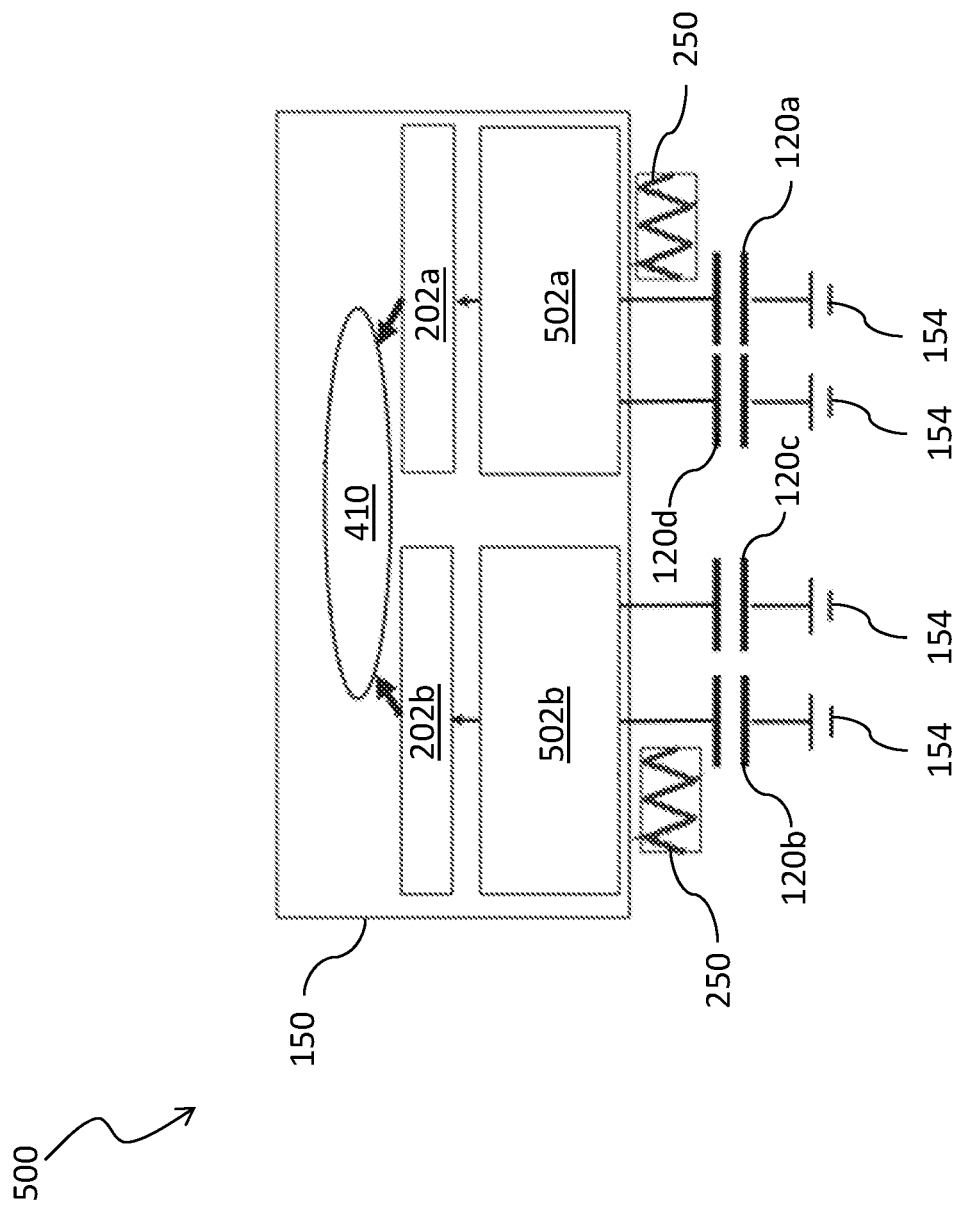
FIG. 6 illustrates a schematic of a system for capacitive fly height measurement, in accordance with some embodiments.

FIG. 6 illustrates a schematic of a system 500 incorporating two capacitive fly height sensors, each with an oscillator circuit and a ground bounce sensing circuit in accordance with some embodiments. The system 500 is similar to the system 400 as described above with respect to FIG. 5, but with two capacitive fly height sensor circuits 502a and 502b each including an oscillator and a ground bounce sensing circuit. The system 500 is thus an embodiment that is a combination of the embodiment of FIG. 5 with the embodiments of FIG. 3 or 4. The capacitive fly height sensor circuit 502a is coupled to a capacitor 120a of a selected head 10 (see above, FIG. 2A) and to a capacitor 120d of an unselected head 10. The capacitive fly height sensor circuit 502b is coupled to a capacitor 120b of another unselected head 10 and to a capacitor 120C of another unselected head 10. As such, the system 500 includes four heads 10 of a head apparatus wo having a plurality of heads 10 (see above, FIG. 2A). The four heads 10 may have any suitable arrangement relative to disks 30 (see above, FIG. 2C). As an example, a first head 10 is on a first side of a first disk 30, a second head 10 is on a second side of the first disk 30 opposite the first side of the first disk 30, a third head 10 is on a first side of a second disk 30 adjacent to the first disk 30, and a fourth head 10 is on a second side of the second disk 30 opposite the first side of the second disk 30.

The capacitive fly height sensor circuit 502a may be similar to the system 200 described above with respect to FIG. 3 or to the system 300 described above with respect to FIG. 4. The capacitor 120d provides common mode rejection of ground noise on the capacitor 120a by differential comparison. This may be useful for removing the ground noise from the signal (e.g., a triangular wave 250) in the capacitive fly height sensor circuit 502a.

The capacitive fly height sensor circuit 502b may also be similar to the system 200 described above with respect to FIG. 3 or to the system 300 described above with respect to FIG. 4. The capacitor 120C provides common mode rejection of ground noise on the capacitor 120b by differential comparison. The capacitive fly height sensor circuit 502b provides further compensation for effects such as thermal drift, ground bounce, and possible time reference variation (e.g., from spin speed error) that are present across the capacitive fly height sensor circuit 502b and the capacitive fly height sensor circuit 502a. This operation is similar to the function of the reference capacitive sensor circuit 402b as described above with respect to FIG. 5.

The example of FIG. 6 refers to a capacitive fly height sensor circuit 502a coupled to a selected head 10 that has its fly height being adjusted as well as an unselected head 10 that is latent and has a constant fly height. The example of FIG. 6 also refers to a capacitive fly height sensor circuit 502b coupled to two unselected heads 10. However, it should be appreciated that the system 500 may also function with any head 10 of the four coupled heads 10 being the selected head 10. As such, the capacitive fly height sensor circuit 502a may be used as a reference for noise subtraction while the capacitive fly height sensor circuit 502b is used for measuring fly height. Additionally, the system 500 may include couplings to additional capacitors of additional heads 10 of a head apparatus 100 having a plurality of heads 10 (see above, FIG. 2A). Any head 10 of the plurality of heads 10 may be the selected head 10, and any other three or more unselected heads 10 may be used as references for common mode noise or time reference variation subtraction.

Figure 7:
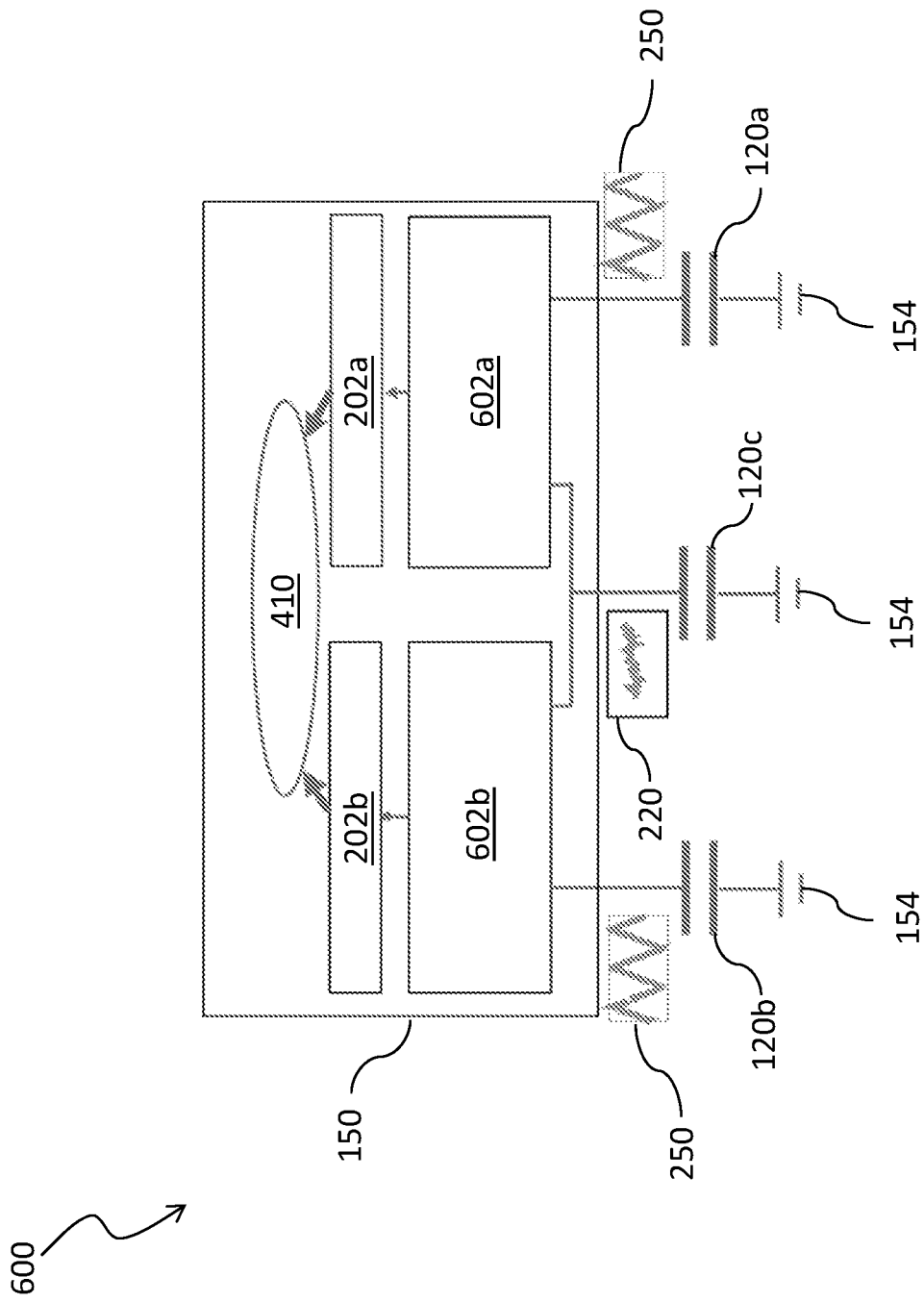
FIG. 7 illustrates a schematic of a system for capacitive fly height measurement, in accordance with some embodiments.

FIG. 7 illustrates a schematic of a system 600 for two capacitive fly height sensors, each having a respective oscillator circuit and sharing a ground bounce sensing circuit, in accordance with some embodiments. The system 600 is similar to the system 500 as described above with respect to FIG. 5, but with a capacitive fly height sensor circuit 602a and a capacitive fly height sensor circuit 602b each including a respective oscillator and sharing a ground bounce sensing circuit including a reference oscillator for noise cancellation. The system 600 is thus an embodiment that is a combination of the embodiment of FIG. 5 with the embodiments of FIG. 3 or 4. The capacitive fly height sensor circuit 602a is coupled to a capacitor 120a of a selected head 10 (see above, FIG. 2A) and to a capacitor 120C of an unselected head 10. The capacitive fly height sensor circuit 602b is coupled to a capacitor 120b of another unselected head 10 and to the same capacitor 120C of the unselected head 10. As such, the system 600 includes three heads 10 of a head apparatus wo having a plurality of heads 10 (see above, FIG. 2A). The three heads 10 may have any suitable arrangement relative to disks 30 (see above, FIG. 2C).

The capacitive fly height sensor circuit 602a may be similar to the system 200 described above with respect to FIG. 3 or to the system 300 described above with respect to FIG. 4. The capacitor 120C provides common mode rejection of noise 220 on the capacitor 120a by differential comparison. This may be useful for removing the noise 220 from the signal (e.g., a triangular wave 250) in the capacitive fly height sensor circuit 602a.

The capacitive fly height sensor circuit 602b may also be similar to the system 200 described above with respect to FIG. 3 or to the system 300 described above with respect to FIG. 4. The capacitor 120C provides common mode rejection of ground noise on the capacitor 120C by differential comparison for the capacitive fly height sensor circuit 602b as well as the capacitive fly height sensor circuit 602a. The capacitive fly height sensor circuit 602b provides further compensation for effects such as thermal drift, ground bounce, and possible time reference variation (e.g., from spin speed error) that are present across the capacitive fly height sensor circuit 602b and the capacitive fly height sensor circuit 602a. This operation is similar to the function of the reference capacitive sensor circuit 402b as described above with respect to FIG. 5.

The example of FIG. 7 refers to a capacitive fly height sensor circuit 602a coupled to a selected head 10 that has its fly height being adjusted as well as an unselected head 10 that is latent and has a constant fly height. The example of FIG. 7 also refers to a capacitive fly height sensor circuit 602b coupled to the unselected head 10 as well as another unselected head 10. However, it should be appreciated that the system 600 may also function with any head 10 of the three coupled heads 10 being the selected head 10. As such, the capacitive fly height sensor circuit 602a may be used as a reference for noise subtraction while the capacitive fly height sensor circuit 602b is used for measuring fly height. Additionally, the system 600 may include couplings to additional capacitors of additional heads 10 of a head apparatus 100 having a plurality of heads 10 (see above, FIG. 2A). Any head 10 of the plurality of heads 10 may be the selected head 10, and any other two or more unselected heads 10 may be used as references for common mode noise or time reference variation subtraction.

Figure 8:
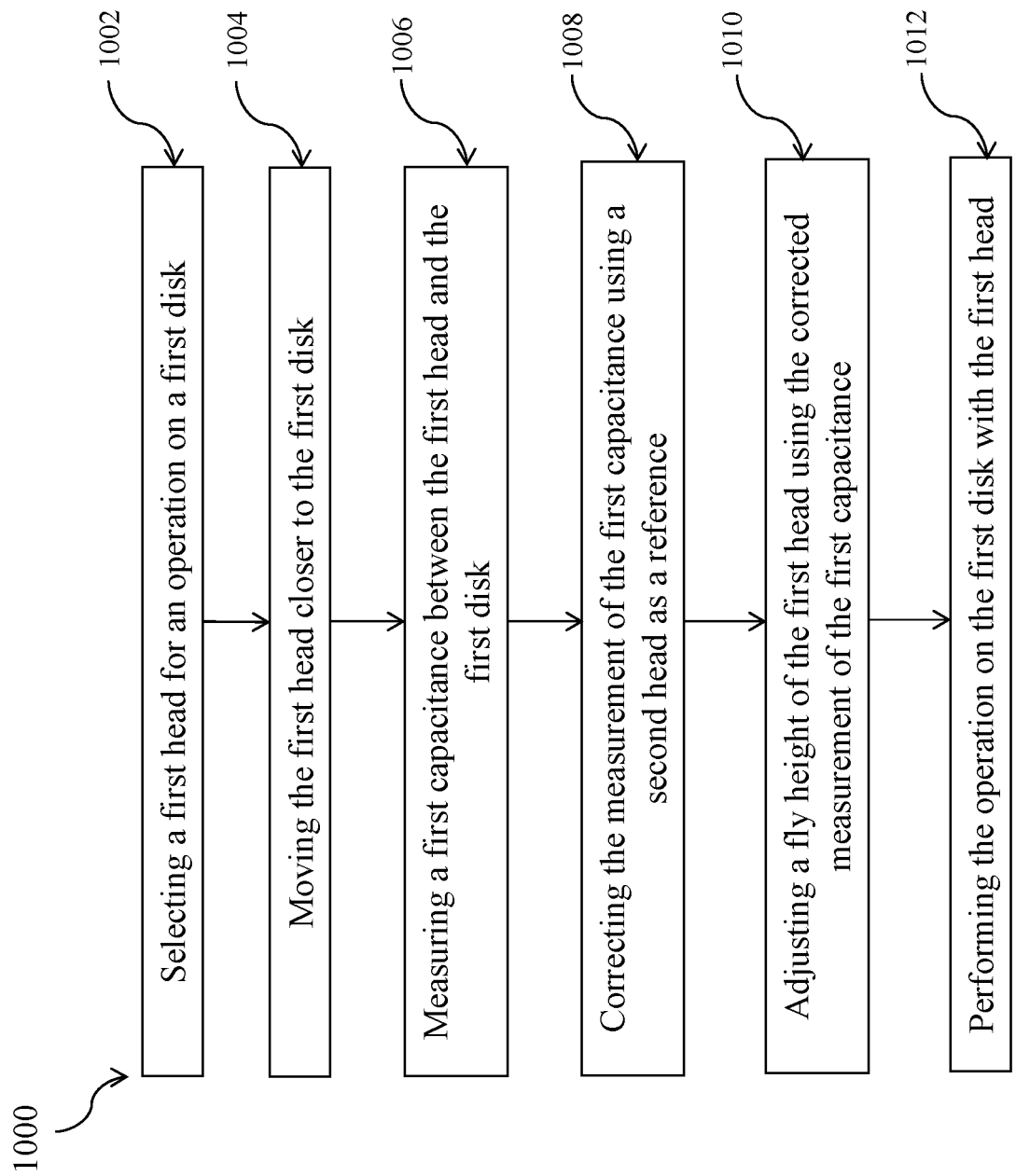
FIG. 8 is a flow chart of an embodiment method for operating a disk drive, in accordance with some embodiments.

FIG. 8 is a flow chart of an embodiment method woo for operating a disk drive, in accordance with some embodiments. The disk drive includes a hard disk drive head apparatus 100 having a plurality of heads 10 (see above, FIG. 2A). Each of the plurality of heads is adjacent to a side of a disk 30 (see above, FIG. 2C) of the disk drive.

In step 1002, a first head 10 is selected for an operation on a first disk 30. The operation may be, e.g., a write operation, a read operation, or the like.

In step 1004, the first head 10 is moved closer to the first disk 30 in order to perform the operation with increased accuracy. The first head 10 may be moved closer to the first disk 30 as described above with respect to FIG. 1.

In step 1006, a fly height of the first head 10 is determined by measuring a first capacitance between the first head 10 and the first disk 30. Measuring the fly height and determining the capacitance may be performed as described above with respect to FIG. 3.

In step 1008, the measurement of the first capacitance is corrected using a second head 10 as a reference. The correction (e.g., noise removal) using the second head as a reference may be performed as described above with respect to FIG. 3, 4, 5, 6, or 7.

In step 1010, the fly height of the first head 10 is adjusted using the corrected measurement of the first capacitance. This may be performed by adjusting the power supplied to a thermal element 24 (see above, FIG. 1) using the corrected measurement of the first capacitance as feedback.

In step 1012, the operation is performed on the first disk 30 using the first head 10. The operation may be performed as described above with respect to FIG. 1.

Using a second hard disk drive head to compensate for the ground noise and thermal drift in using capacitance measurements to determine fly height may lead to frequency pulling issues. This may be due to capacitive coupling at the board or flex level. Coupling and cross-talk on the flexible connection 104 (see above, FIGS. 2B and 2D) between two capacitive fly height sensor circuits (with one used to measure capacitance and the other used to sense thermal drift) may result in frequency pulling. If the oscillation frequencies of the oscillators (in other words, the capacitive fly height sensor circuits) are close to each other, frequency tracking may occur between the two oscillators. This can mask information about capacitance measurement and thermal drift sensing.

Respective switches may be added between the capacitive fly height sensor circuits and their respective disk drive heads, such as at nodes 230 (see above, FIGS. 3-4). In other words, the respective switches may be between the disk drive heads and the preamp. The nodes 230 may be at pins coupling the capacitive fly height sensor circuits to their respective disk drive heads. The switches allow for disconnecting the sensor circuits from their respective loads (in other words, from the disk drive heads and their associated capacitance with the disk). When a reference sensor circuit (in other words, a capacitive fly height sensor circuit of an inactive disk drive head) is selected in order to track the thermal drift of the system and compensate for it in another capacitive fly height sensor circuit coupled with the active disk drive head, the respective switch between the reference sensor circuit and the disk drive head is opened. With the switch open, the oscillation frequency of the reference sensor circuit depends on parasitic capacitance in the circuit. The oscillation frequency of the reference sensor circuit continues to track the oscillation frequency drift of the capacitive fly height sensor circuit arising from thermal variation (such as from low-pass filter or comparator delay). As board coupling between the capacitive fly height sensor circuit and the reference sensor circuit is reduced or eliminated by the open switch, the oscillation frequency of the reference sensor circuit may be used to compensate for thermal noise drift in the capacitive fly height sensor circuit.

Figure 9:
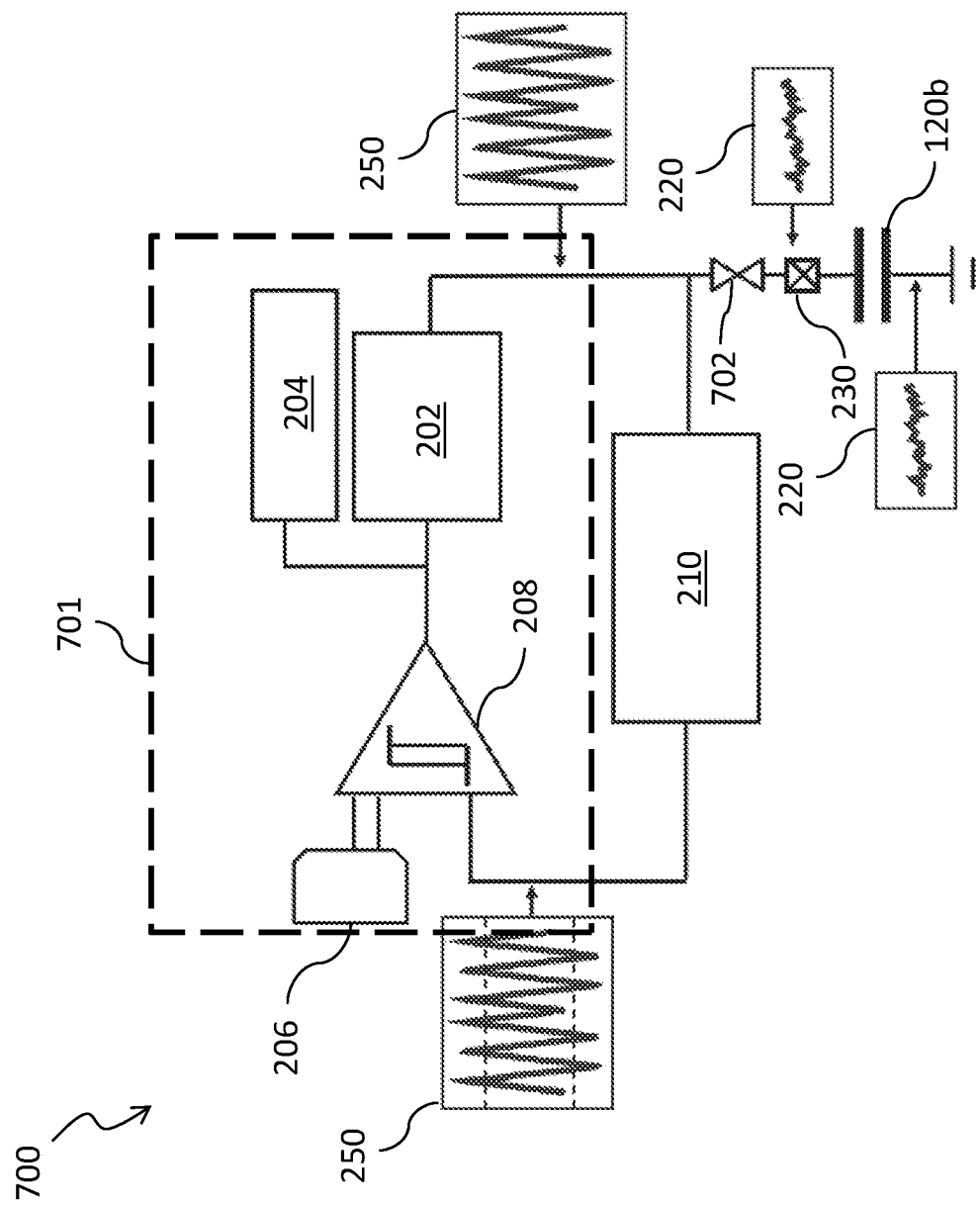
FIG. 9 illustrates a schematic of a system for capacitive fly height measurement, in accordance with some embodiments.
Figure 10:
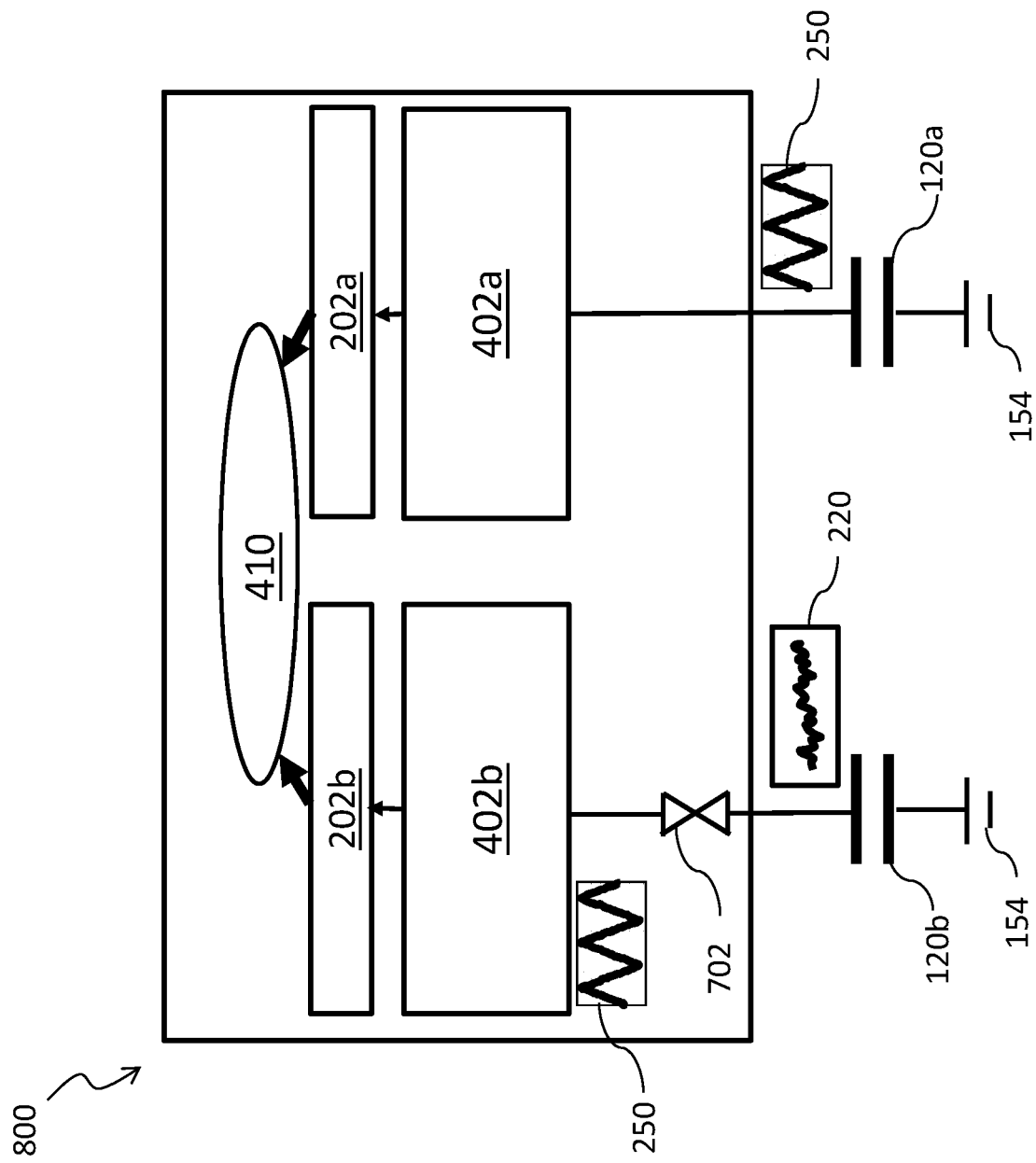
FIG. 10 illustrates a schematic of a system for capacitive fly height measurement, in accordance with some embodiments.
Figure 11:
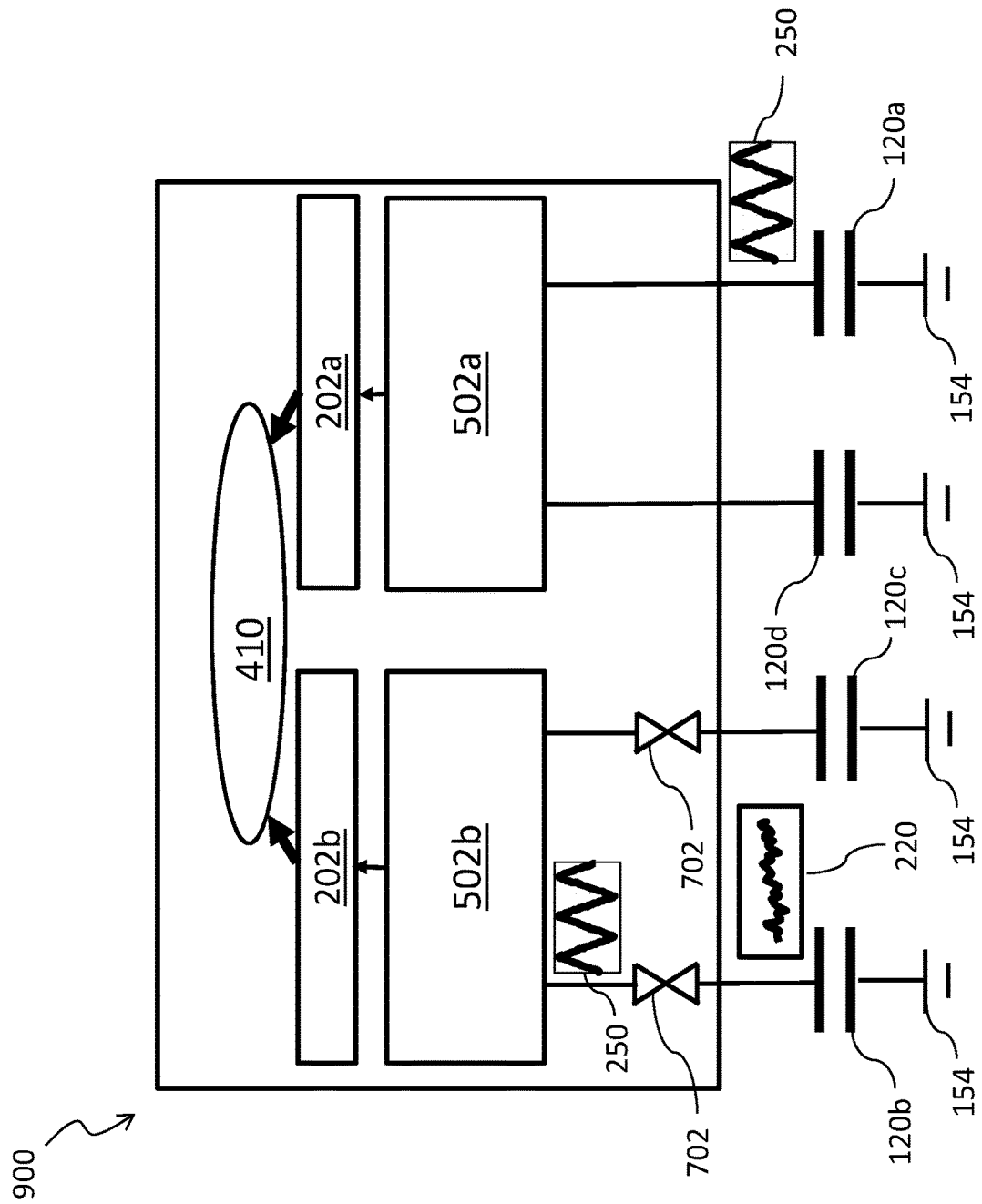
FIG. 11 illustrates a schematic of a system for capacitive fly height measurement, in accordance with some embodiments.

FIGS. 9-11 illustrate schematics of circuits comprising switches between reference sensor circuits and disk drive heads. FIG. 9 illustrates an example schematic of a system 700 for a reference sensor circuit 701 with a switch 702 between the reference sensor circuit 701 and a disk drive head, in accordance with some embodiments. The system 700 is illustrated as a simplified version of the system 300 as described above with respect to FIG. 3, and the details are not repeated herein. Although only one node 230, capacitor 120b, and quality booster circuit 210 are illustrated in FIG. 9, it should be understood that a capacitor 120a, another node 230, and another quality booster circuit 210 may be present as illustrated in FIG. 3. In some embodiments, the reference sensor circuit 701 includes a current source 202, a counter 204, a threshold digital-to-analog converter (DAC) 206, and a hysteresis comparator 208.

A switch 702 (e.g., a pass-gate) is coupled between the node 230 and the conduction path between the current source 202 and the quality booster circuit 210. The switch 702 allows for the capacitor 120b of an unselected head to be disconnected from the reference sensor circuit 701. When the switch 702 is open, the oscillation frequency of the reference sensor circuit 701 depends on parasitic capacitance in the circuit and/or on integrated capacitors that may be coupled for this purpose so that the oscillation frequency is not dependent only on parasitic capacitance (not illustrated in FIG. 9). In some embodiments, one or more external capacitors are coupled by one or more respective switch(es) to the reference sensor circuit 701. This allows for board coupling with a capacitive fly height sensor circuit of a selected head (not illustrated) to be reduced or eliminated. The oscillation frequency of the reference sensor circuit 701 may be used to compensate for thermal noise drift in the capacitive fly height sensor circuit of the selected head. When the switch 702 is closed, the reference sensor circuit 701 may be used as a capacitive fly height sensor circuit for its respective head corresponding to the capacitor 120b.

FIG. 10 illustrates a schematic of a system 80o incorporating two capacitive fly height sensors, in accordance with some embodiments. The system 80o is similar to the system 400 as described above with respect to FIG. 5 with the addition of a switch 702, and the details are not repeated herein. The switch 702 is coupled between the reference capacitive sensor circuit 402b and the capacitor 120b of an unselected head 10. In some embodiments, another switch 702 is present between the capacitive fly height sensor circuit 402a and a capacitor 120a of a selected head 10. The switch 702 may be opened to isolate the reference capacitive sensor circuit 402b from board coupling to the capacitive fly height sensor circuit 402a. This may be useful for using the reference capacitive sensor circuit 402b to compensate for thermal noise drift in the capacitive fly height sensor circuit 402a of the selected head 10, similar to the reference sensor circuit 701 as described above with respect to FIG. 9.

FIG. 11 illustrates a schematic of a system 900 incorporating two capacitive fly height sensors, each with an oscillator circuit and a ground bounce sensing circuit in accordance with some embodiments. The system 900 is similar to the system 500 as described above with respect to FIG. 6 with the addition of two switches 702, and the details are not repeated herein. One switch 702 couples between capacitor 120b and an oscillator circuit of the capacitive fly height sensor circuit 502a, and the other switch 702 couples between capacitor 120C and a ground bounce sensing circuit of the capacitive fly height sensor circuit 502a. The system 500 is thus an embodiment that is a combination of the embodiment of FIG. 6 with the embodiments of FIG. 10. In some embodiments, additional switches 702 are present between the capacitive fly height sensor circuit 502a and the capacitors 120a and 120b. The switches 702 may be opened to isolate the oscillator circuit and the ground bounce sensor circuit from the capacitor 120b and the capacitor 120C, respectively, when the heads coupled to the oscillator circuit and the ground bounce sensor circuit are not in use. This may be useful for using the capacitive fly height sensor circuit 502b to compensate for thermal noise drift in the capacitive fly height sensor circuit 502a, similar to the reference sensor circuit 701 as described above with respect to FIG. 9.

In some embodiments, systems further include built-in self-test (BIST) functionality to evaluate the frequency response profiles of low-pass filters, gain-increasing elements (e.g., an operational amplifier), level shifters, or other elements of quality booster circuits 210 or 310. No external resources may be needed for the BIST functionality.

Low-pass filters may be added to capacitive fly height sensor circuits in order to remove high frequency noise from oscillator loops and improve the accuracy of oscillation frequency measurement. Other quality boosting elements such as gain-increasing elements or level shifters may also be added. However, the latency resulting from these elements (such as from the frequency response of low-pass filters) may have a direct effect on fly height measurement accuracy. Therefore, it is desirable to evaluate the low-pass filters or other quality boosting elements with automatic testing equipment (ATE) to detect device failures.

The oscillation period of a capacitive fly height sensor circuits in a first approximation is $$T \cong \frac{C_{hd} \times V_{th}}{I_{chg}} + 4 \times tg,$$

where tg is the phase delay of the circuits inside the oscillation loop. This phase delay may affect the accuracy of measurements of the capacitance $C_{hd}$ and the resulting fly height measurements. The frequency response profile of a low-pass filter (or of another quality booster circuit element) may be a significant contributor to the phase delay tg. It is advantageous to evaluate the phase delay tg with automatic testing equipment. However, it may be difficult for automatic testing equipment outside of the chip containing the capacitive fly height sensor circuit to evaluate the phase delay with a high degree of accuracy due to, for example, band limitation of buffers used to connect the inside of the circuit with external equipment or parasitic capacitance of the interconnection of the circuit with the measurement block that may impact the band. As such, it is beneficial to implement a BIST in the same device as the capacitive fly height sensor circuit (also referred to as a reference sensor circuit) without using external resources to evaluate the frequency response profile of the low-pass filter (or other quality booster circuit element).

Figure 12:
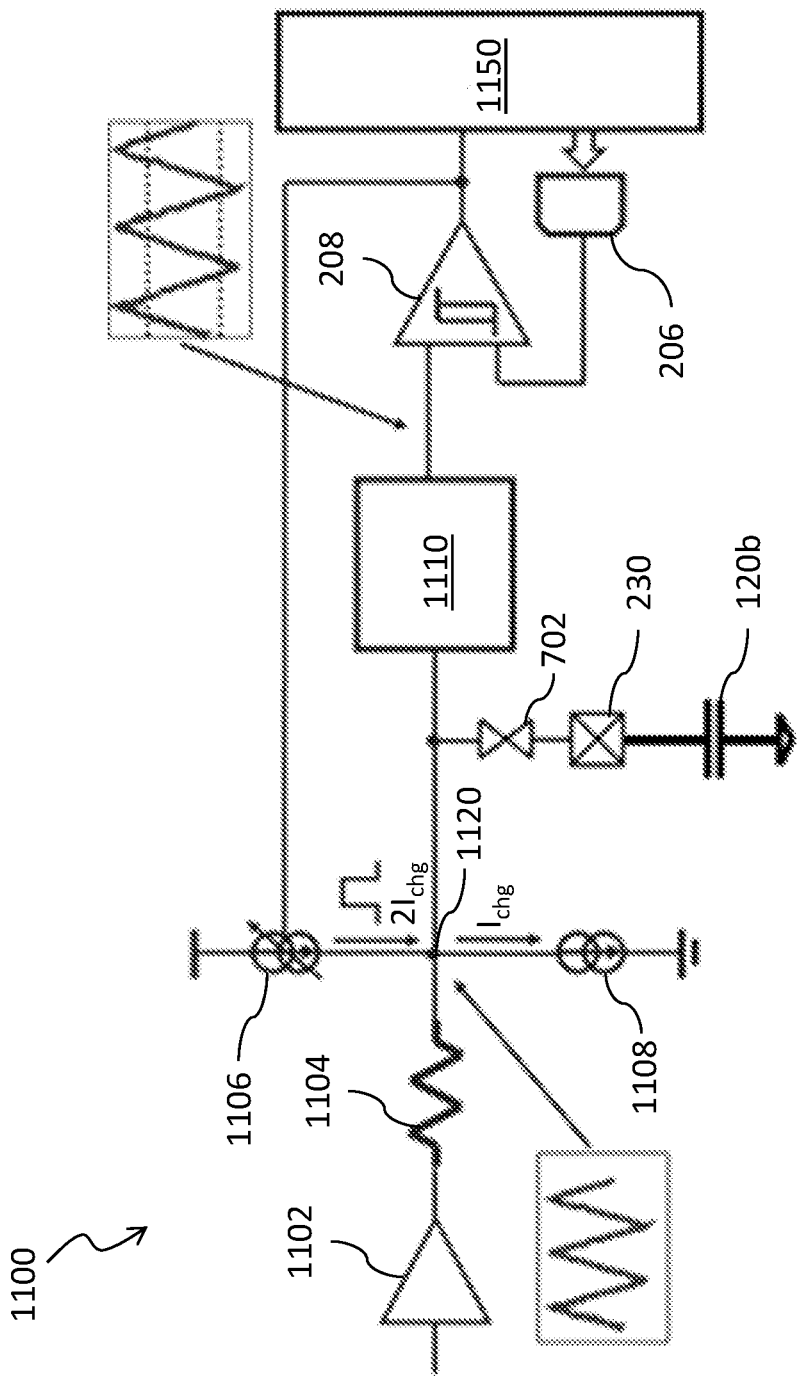
FIGS. 12-14 illustrate schematics of systems for capacitive fly height measurement with built-in self test functionality, in accordance with some embodiments.
Figure 13:
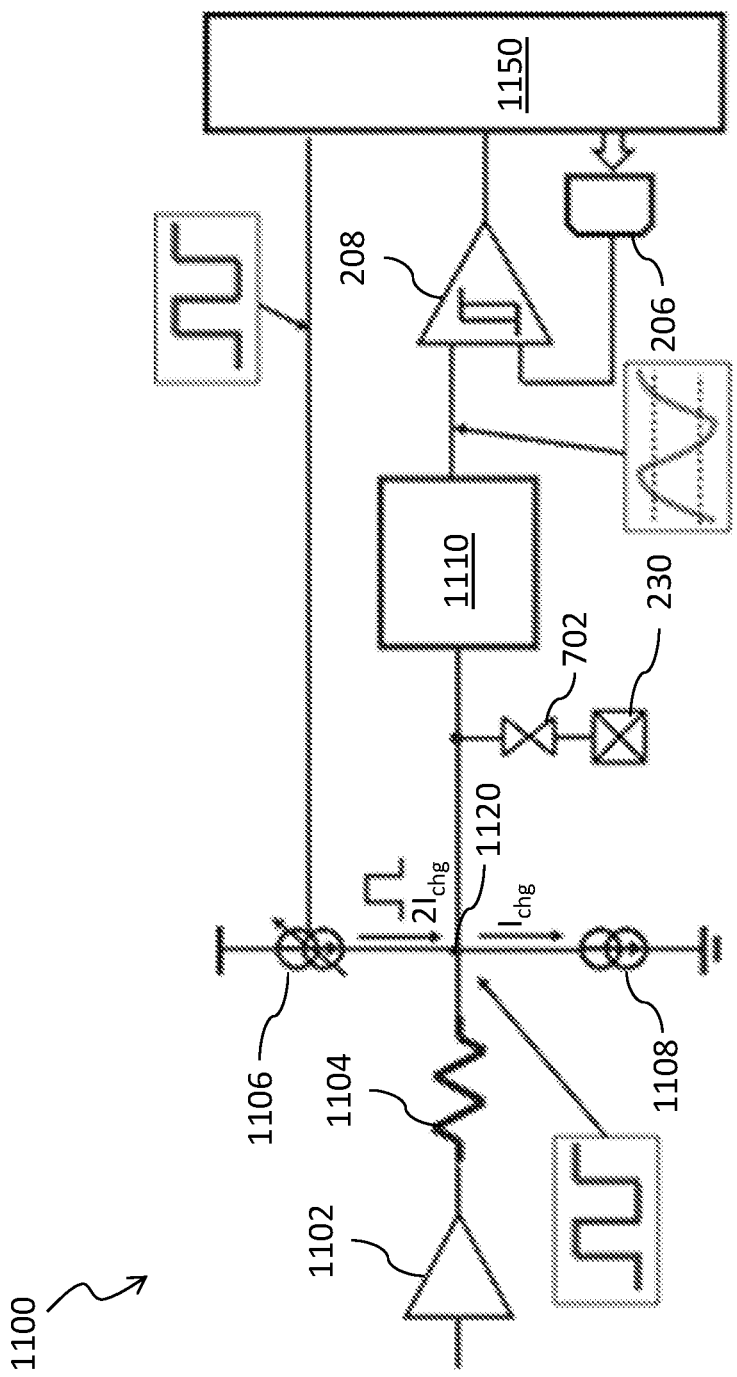

FIGS. 12 and 13 illustrate schematics of a circuit 1100 comprising a BIST to evaluate the frequency response profile of a quality boosting element (e.g., a low-pass filter). FIG. 12 illustrates a schematic of the circuit 1100 in a functional mode (in other words, configured to perform a fly height measurement) and FIG. 13 illustrates a schematic of the circuit 1100 in a BIST mode (in other words, configured to perform a built-in self-test). A quality boosting element 1110 (which may be a low-pass filter, gain-increasing element (e.g., an operational amplifier), level shifter, or a combination thereof) is coupled between a hysteresis comparator 208 and a capacitor 120b (e.g., the capacitance of an unselected disk drive head with a disk) through a switch 702 and a node 230. The hysteresis comparator 208 accepts inputs from the quality boosting element 1110 and a threshold DAQ 206. A digital logic circuit 1150 (e.g., a logic device 410 (see above, FIG. 5) or other controller such as a processor, microprocessor, or the like) provides a controlling input to the threshold DAQ 206 and receives output from the hysteresis comparator 208. In some embodiments, the digital logic circuit 1150 is coupled to the counter 204 or is configured to perform counting like the counter 204 as described above with respect to FIG. 3. The digital logic circuit 1150 is implemented in a same device as the quality boosting element 1110, the hysteresis comparator 208, and the threshold DAQ 206 in order to run built-in self-tests (BISTs).

When the circuit 1100 is in functional mode as illustrated in FIG. 12, the digital logic circuit 1150 provides the output of the hysteresis comparator 208 to a variable current source 1106, which is coupled through a node 1120 to the quality boosting element 1110 and the switch 702. The node 1120 is further coupled to a DC bias amplifier 1102 across a resistor 1104 to provide a DC bias current and to a ground node across a current source 1108. In some embodiments, a current 2 $I_{chg}$ flows from the variable current source 1106 into the node 1120 and a current $Ich_{chg}$ flows from the node 1120 to the current source 1108. The variable current source 1106, DC bias amplifier 1102, resistor 1104, and current source 1108 are equivalent to the current source 202 as described above with respect to FIG. 3 in the functional mode of the circuit 1100.

FIG. 13 illustrates the circuit 1100 in BIST mode (in other words, running a built-in self-test to evaluate the performance of the quality boosting element 1110). The switch 702 is closed (such as by opening a pass-gate), decoupling the capacitor 120b (see above, FIG. 12) from the rest of the circuit 1100. The digital logic circuit 1150 provides a test signal such as a square wave from a clock in the digital logic circuit 1150 to drive the variable current source 1106 and the resulting charge/discharge current instead of the output of the hysteresis comparator 208 (as in functional mode; see above, FIG. 12).

The test signal passes through the quality boosting element 1110 (e.g., a low-pass filter) and the resulting signal (e.g., a sawtooth wave) is received as input by the hysteresis comparator evaluated by the digital logic circuit 1150. The digital logic circuit 1150 drives the threshold DAQ 206 in order to change the threshold of the hysteresis comparator 208 while monitoring the output activity of the hysteresis comparator 208. The digital logic circuit 1150 evaluates the amplitude of the received signal at its input from the hysteresis comparator 208. The digital logic circuit 1150 then repeats the test, such as by changing the frequency of the clock driving the test signal, to evaluate the shape of the frequency response from the quality boosting element 1110. If the frequency response of the quality boosting element 1110 is outside a desired range, the digital logic circuit 1150 provides notification that the quality boosting element 1110 has failed the built-in self-test (BIST). After running a BIST, the quality boosting element 1110 may return the circuit 1100 to functional mode. This BIST does not need external resources and so measurements are advantageously not affected by, for example, band limitation of buffers used to connect the inside of the circuit with external equipment or parasitic capacitance of the interconnection of the circuit with the measurement block.

Figure 14:
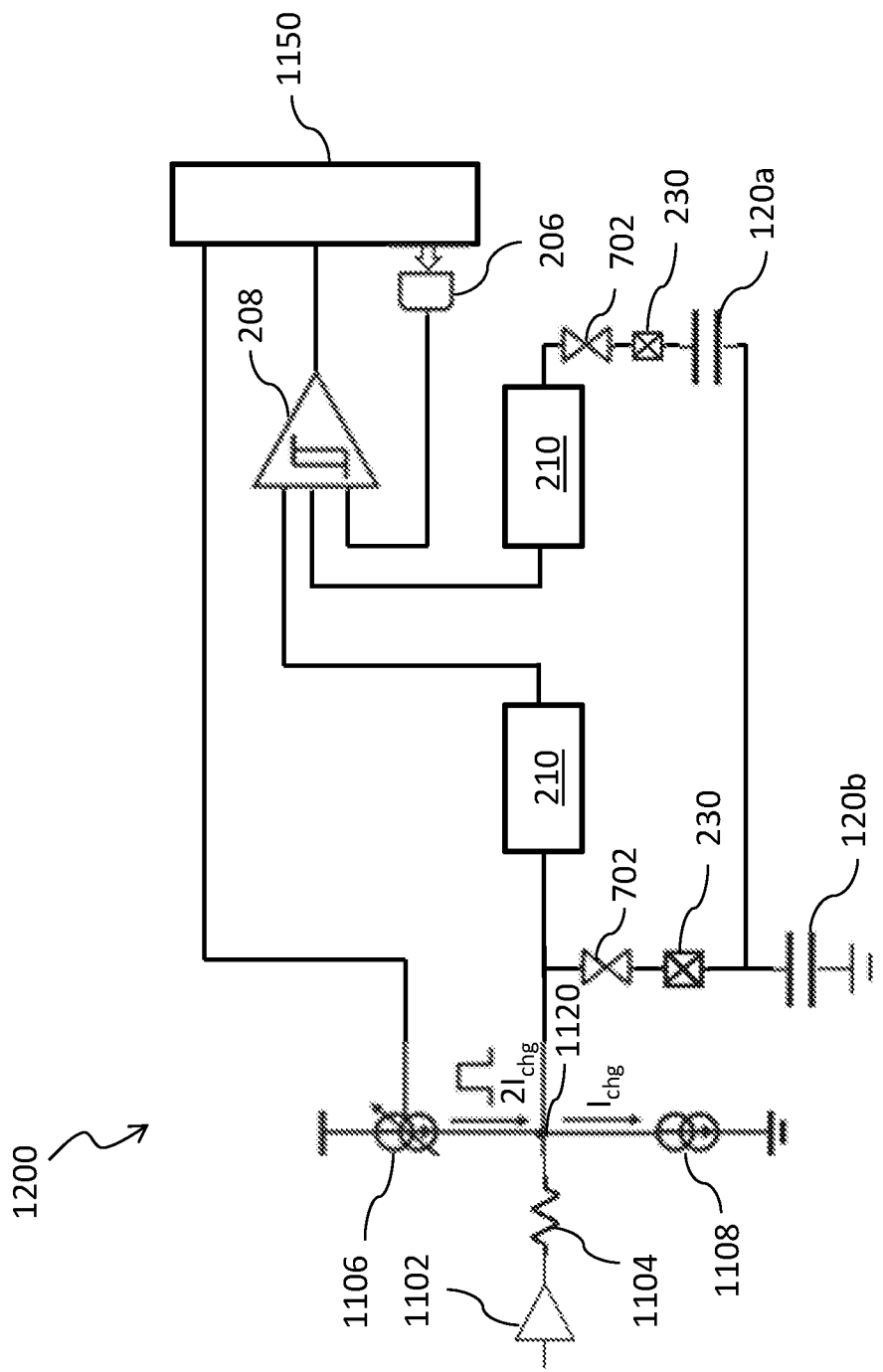

FIG. 14 illustrates a schematic of a system 1200 for a capacitive fly height sensor with ground sensing having one or more switches 702 and built-in self-test functionality, in accordance with some embodiments. The system 1200 is similar to the system 200 as described above with respect to FIG. 3 with the addition of switches 702 and built-in self-test functionality. The system 1200 is thus an embodiment that is a combination of the embodiment of FIG. 3 with the embodiments of FIGS. 9 and FIGS. 12-13, and the details are not repeated herein. Although not illustrated in FIG. 14, the digital logic circuit 1150 may provide output to a current source in order to test the quality booster circuit 210 coupled to the capacitor 120a in addition to the illustrated circuitry to test the quality booster circuit 210 coupled to the capacitor 120b. In some embodiments, the switches 702 and BIST functionality are combined with the embodiment of FIG. 4 (with a differential quality booster circuit 310) or with the embodiments of FIG. 5, 6, or 7. Any and all such suitable combinations are within the scope of the disclosed embodiments.

Figure 15:
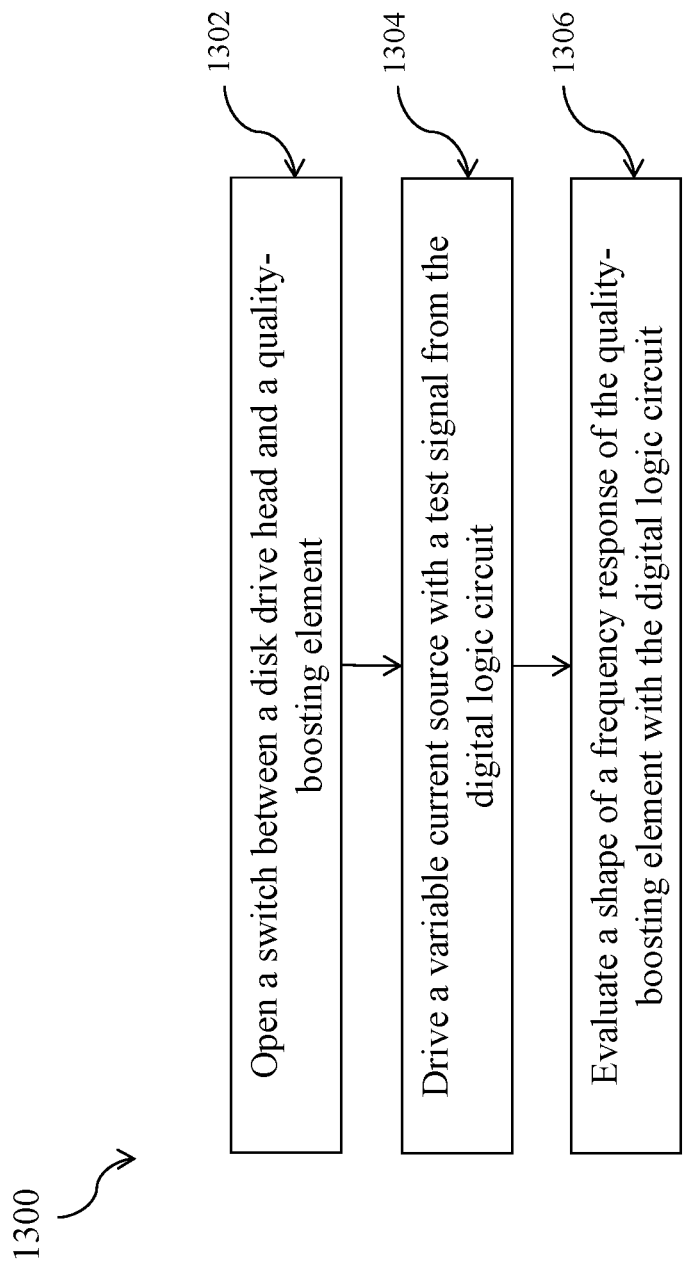
FIG. 15 is a flow chart of an embodiment method for testing a circuit, in accordance with some embodiments.

FIG. 15 is a flow chart of an embodiment method 1300 for testing a circuit, in accordance with some embodiments. In step 1302, a switch 702 between a disk drive head and a quality boosting element 1110 is opened, as described above with respect to FIG. 13. The quality boosting element 1110 is coupled to a first input of a comparator (e.g., a hysteresis comparator 208). An output of the comparator is coupled to a digital logic circuit 1150. The digital logic circuit 1150 is in a same device as the quality boosting element 1110.

In step 1304, the digital logic circuit 1150 drives a variable current source 1106 with a test signal from the digital logic circuit 1150. The variable current source provides the test signal to the quality boosting element 1110.

In step 1306, the digital logic circuit 1150 evaluates a shape of a frequency response of the quality boosting element 1110 while changing a threshold of the comparator. In some embodiments, the quality boosting element 1110 is a low-pass filter.

Example embodiments of the disclosure are summarized here. Other embodiments can also be understood from the entirety of the specification as well as the claims filed herein.

Example 1. A system for determining a fly height, including: a first head of a disk drive, the first head being adjacent to a first disk; a capacitive fly height sensor circuit coupled to the first head, where the capacitive fly height sensor circuit is configured to measure a first capacitance between the first head and the first disk; a reference sensor circuit, where the reference sensor circuit is configured to experience a same thermal drift as the capacitive fly height sensor circuit; and a logic circuit, the logic circuit being coupled to the capacitive fly height sensor circuit and the reference sensor circuit, where the logic circuit is configured to: remove noise to correct a measurement of the capacitive fly height sensor circuit using a measurement of the reference sensor circuit; and determine the fly height between the first head and the first disk using the corrected measurement of the capacitive fly height sensor circuit.

Example 2. The system of example 1, further including a second head of the disk drive, where the reference sensor circuit is coupled to the second head along a first conduction path.

Example 3. The system of example 2, further including a first switch along the first conduction path, where the reference sensor circuit is coupled to the second head through the first switch.

Example 4. The system of one of examples 2 or 3, further including a third head of the disk drive, where the reference sensor circuit is coupled to the third head along a second conduction path.

Example 5. The system of example 4, further including a second switch along the second conduction path, where the reference sensor circuit is coupled to the second head through the second switch.

Example 6. The system of one of examples 1 to 5, where the reference sensor circuit includes a quality booster circuit.

Example 7. The system of example 6, where the logic circuit is further configured to run a built-in self-test of a frequency response of the quality booster circuit.

Example 8. The system of example 7, where the quality booster circuit includes a low-pass filter.

Example 9. A system for determining a fly height, including: a first head of a disk drive, the first head being adjacent to a first disk; a capacitive fly height sensor circuit coupled to the first head, where the capacitive fly height sensor circuit is configured to measure a first capacitance between the first head and the first disk; a second head of the disk drive, the second head being adjacent to a second disk; a reference sensor circuit coupled to the second head through a first switch; and a logic circuit, the logic circuit being coupled to the capacitive fly height sensor circuit and the reference sensor circuit, where the logic circuit is configured to: remove noise to correct a measurement of the capacitive fly height sensor circuit using a measurement of the reference sensor circuit when the first switch is open; and determine the fly height between the first head and the first disk using the corrected measurement of the capacitive fly height sensor circuit.

Example 10. The system of example 9, where the capacitive fly height sensor circuit and the reference sensor circuit are identical circuits.

Example 11. The system of one of examples 9 or 10, further including a third head of the disk drive, the capacitive fly height sensor circuit being coupled to the third head, where the capacitive fly height sensor circuit is further configured to measure a second capacitance between the third head and the first disk.

Example 12. The system of one of examples 9 to 11, where measuring the first capacitance between the first head and the first disk includes charging and discharging a capacitor with a current source, the capacitor being formed by the first head and the first disk.

Example 13. The system of one of examples 9 to 12, where the reference sensor circuit includes a low-pass filter.

Example 14. The system of example 13, further including a digital logic circuit configured to perform a built-in self-test (BIST) of the low-pass filter.

Example 15. The system of example 14, where the digital logic circuit is the logic circuit.

Example 16. The system of one of examples 14 or 15, where the reference sensor circuit further includes a variable current source driven by the digital logic circuit, the variable current source being coupled to the low-pass filter through a first node.

Example 17. The system of example 16, where the reference sensor circuit further includes a current source coupled between the first node and a ground node.

Example 18. The system of one of examples 16 or 17, where the reference sensor circuit further includes a DC bias amplifier coupled to the first node across a resistor.

Example 19. A method for testing a circuit, the method including: opening a switch between a disk drive head and a quality boosting element, the quality boosting element being coupled to a first input of a comparator, an output of the comparator being coupled to a digital logic circuit, the digital logic circuit being in a same device as the quality boosting element; driving a variable current source with a test signal from the digital logic circuit, the variable current source providing the test signal to the quality boosting element; and while changing a threshold of the comparator, evaluating a shape of a frequency response of the quality boosting element with the digital logic circuit.

Example 20. The method of example 19, where the quality boosting element is a low-pass filter.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A system for determining a fly height, comprising:
   a first head of a disk drive, the first head being adjacent to a first disk;
   a capacitive fly height sensor circuit coupled to the first head, wherein the capacitive fly height sensor circuit is configured to measure a first capacitance between the first head and the first disk;
   a reference sensor circuit, wherein the reference sensor circuit is configured to experience a same thermal drift as the capacitive fly height sensor circuit; and
   a logic circuit, the logic circuit being coupled to the capacitive fly height sensor circuit and the reference sensor circuit, wherein the logic circuit is configured to:
      remove noise to correct a measurement of the capacitive fly height sensor circuit using a measurement of the reference sensor circuit; and
      determine the fly height between the first head and the first disk using the corrected measurement of the capacitive fly height sensor circuit.

2. The system of claim 1, further comprising a second head of the disk drive, wherein the reference sensor circuit is coupled to the second head along a first conduction path.

3. The system of claim 2, further comprising a first switch along the first conduction path, wherein the reference sensor circuit is coupled to the second head through the first switch.

4. The system of claim 2, further comprising a third head of the disk drive, wherein the reference sensor circuit is coupled to the third head along a second conduction path.

5. The system of claim 4, further comprising a second switch along the second conduction path, wherein the reference sensor circuit is coupled to the second head through the second switch.

6. The system of claim 1, wherein the reference sensor circuit comprises a quality booster circuit.

7. The system of claim 6, wherein the logic circuit is further configured to run a built-in self-test of a frequency response of the quality booster circuit.

8. The system of claim 7, wherein the quality booster circuit comprises a low-pass filter.

9. A system for determining a fly height, comprising:
   a first head of a disk drive, the first head being adjacent to a first disk;
   a capacitive fly height sensor circuit coupled to the first head, wherein the capacitive fly height sensor circuit is configured to measure a first capacitance between the first head and the first disk;
   a second head of the disk drive, the second head being adjacent to a second disk;
   a reference sensor circuit coupled to the second head through a first switch; and
   a logic circuit, the logic circuit being coupled to the capacitive fly height sensor circuit and the reference sensor circuit, wherein the logic circuit is configured to:
      remove noise to correct a measurement of the capacitive fly height sensor circuit using a measurement of the reference sensor circuit when the first switch is open; and
      determine the fly height between the first head and the first disk using the corrected measurement of the capacitive fly height sensor circuit.

10. The system of claim 9, wherein the capacitive fly height sensor circuit and the reference sensor circuit are identical circuits.

11. The system of claim 9, further comprising a third head of the disk drive, the capacitive fly height sensor circuit being coupled to the third head, wherein the capacitive fly height sensor circuit is further configured to measure a second capacitance between the third head and the first disk.

12. The system of claim 9, wherein measuring the first capacitance between the first head and the first disk comprises charging and discharging a capacitor with a current source, the capacitor being formed by the first head and the first disk.

13. The system of claim 9, wherein the reference sensor circuit comprises a low-pass filter.

14. The system of claim 13, further comprising a digital logic circuit configured to perform a built-in self-test (BIST) of the low-pass filter.

15. The system of claim 14, wherein the digital logic circuit is the logic circuit.

16. The system of claim 14, wherein the reference sensor circuit further comprises a variable current source driven by the digital logic circuit, the variable current source being coupled to the low-pass filter through a first node.

17. The system of claim 16, wherein the reference sensor circuit further comprises a current source coupled between the first node and a ground node.

18. The system of claim 16, wherein the reference sensor circuit further comprises a DC bias amplifier coupled to the first node across a resistor.

19. A system for determining a fly height, comprising:
a first head of a disk drive, the first head being adjacent to a first disk;
a capacitive fly height sensor circuit coupled to the first head, wherein the capacitive fly height sensor circuit is configured to measure a first capacitance between the first head and the first disk, the capacitive fly height sensor circuit comprising a comparator and a quality boosting element, the quality boosting element being coupled to a first input of the comparator;
a reference sensor circuit, wherein the reference sensor circuit is configured to experience a same thermal drift as the capacitive fly height sensor circuit; and
a digital logic circuit, the digital logic circuit being coupled to the capacitive fly height sensor circuit and the reference sensor circuit, an output of the comparator being coupled to the digital logic circuit, wherein the digital logic circuit is configured to:
remove noise to correct a measurement of the capacitive fly height sensor circuit using a measurement of the reference sensor circuit;
determine the fly height between the first head and the first disk using the corrected measurement of the capacitive fly height sensor circuit;
drive a variable current source with a test signal from the digital logic circuit, the variable current source providing the test signal to the quality boosting element; and
while changing a threshold of the comparator, evaluate a shape of a frequency response of the quality boosting element.

20. The system of claim 19, wherein the quality boosting element is a low-pass filter.

* * * * *